(12) United States Patent
Sasaki et al.

(10) Patent No.: US 9,728,713 B2
(45) Date of Patent: Aug. 8, 2017

(54) MAGNETORESISTIVE ELEMENT, SPIN MOSFET, MAGNETIC SENSOR, AND MAGNETIC HEAD

(71) Applicant: TDK Corporation, Tokyo (JP)

(72) Inventors: Tomoyuki Sasaki, Tokyo (JP); Tohru Oikawa, Tokyo (JP); Hayato Koike, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/038,244

(22) PCT Filed: Nov. 14, 2014

(86) PCT No.: PCT/JP2014/080132
§ 371 (c)(1),
(2) Date: May 20, 2016

(87) PCT Pub. No.: WO2015/076187
PCT Pub. Date: May 28, 2015

(65) Prior Publication Data
US 2016/0284982 A1   Sep. 29, 2016

(30) Foreign Application Priority Data

Nov. 20, 2013  (JP) ................................. 2013-239735

(51) Int. Cl.
*H01L 43/08* (2006.01)
*G01R 33/09* (2006.01)
(Continued)

(52) U.S. Cl.
CPC ............ *H01L 43/08* (2013.01); *G01R 33/098* (2013.01); *H01L 29/66984* (2013.01);
(Continued)

(58) Field of Classification Search
CPC .... H01L 29/66984; H01L 43/02; H01L 43/08
See application file for complete search history.

(56) References Cited

U.S. PATENT DOCUMENTS

| 8,488,282 | B2 * | 7/2013 | Sasaki ................... B82Y 25/00 |
| | | | 257/422 |
| 9,401,419 | B2 * | 7/2016 | Sasaki .............. H01L 29/66984 |
| 2005/0282379 | A1 | 12/2005 | Saito et al. |
| 2006/0114018 | A1 | 6/2006 | Sugahara et al. |
| 2010/0314702 | A1 | 12/2010 | Sasaki et al. |
| 2011/0244268 | A1 | 10/2011 | Sasaki |

FOREIGN PATENT DOCUMENTS

| JP | 2006-032915 A | 2/2006 |
| JP | 2010-287666 A | 12/2010 |
| WO | 2004/086625 A1 | 10/2004 |

OTHER PUBLICATIONS

A. Fert et al. "Conditions for Efficient Spin Injection from a Ferromagnetic Metal into a Semiconductor". Physical Review B, vol. 64, 2001, No. 184420, pp. 1-9.

(Continued)

*Primary Examiner* — Allison P Bernstein
(74) *Attorney, Agent, or Firm* — Oliff PLC

(57) ABSTRACT

Spin-transport elements using semiconductors have had the problem of higher element resistance than conventional GMR elements and TMR elements, making it difficult to obtain high magnetoresistance ratios. A magnetoresistive element including a semiconductor channel layer; a first ferromagnetic layer disposed on the semiconductor channel layer; a second ferromagnetic layer disposed away from the first ferromagnetic layer; and a non-magnetic first reference electrode disposed away from the first ferromagnetic layer and the second ferromagnetic layer, wherein current is input from the second ferromagnetic layer to the first ferromagnetic layer through the semiconductor channel layer, a voltage between the second ferromagnetic layer and the first reference electrode is output.

13 Claims, 15 Drawing Sheets

(51) Int. Cl.
    *H01L 29/66*     (2006.01)
    *H01L 29/82*     (2006.01)
    *H01L 43/02*     (2006.01)
    *G11B 5/39*     (2006.01)
    *H01L 29/10*     (2006.01)

(52) U.S. Cl.
    CPC .............. *H01L 29/82* (2013.01); *H01L 43/02* (2013.01); *G11B 5/3909* (2013.01); *G11B 2005/3996* (2013.01); *H01L 29/1033* (2013.01)

(56) References Cited

OTHER PUBLICATIONS

T. Sasaki et al. "Local and Non-Local Magnetoresistance With Spin Precession in Highly Doped Si". Applied Physics Letters, vol. 98, Jun. 28, 2011, pp. 1-3.

T. Kimura et al. "Spin-Dependent Boundary Resistance in the Lateral Spin-Valve Structure". Applied Physics Letters, vol. 85, No. 16, Oct. 18, 2004, pp. 3501-3503.

Biqin Huang et al. "Coherent Spin Transport Through a 350 Micron Thick Silicon Wafer". Physical Review Letters, vol. 99, No. 177209, Oct. 26, 2007, pp. 1-4.

Tomoyuki Sasaki et al. "Spin Transport in Nondegenerate Si with a Spin MOSFET Structure at Room Temperature". Physical Review Applied, vol. 2, No. 034005, 2014, pp. 1-6.

Jun. 14, 2017 Search Report issued in European Patent Application No. 14864839.7.

Saito et al; "Spin injection, transport, and read/write operation in spin-based MOSFET;" Thin Solid Films; 2011; vol. 519; No. 23; pp. 8266-8273.

Lee et al; "Temperature dependence of spin injection efficiency in an epitaxially grown Fe/GaAs hybrid structure;" Journal of Magnetism and Magnetic Materials; 2009; vol. 321; No. 22; pp. 3795-3798.

\* cited by examiner

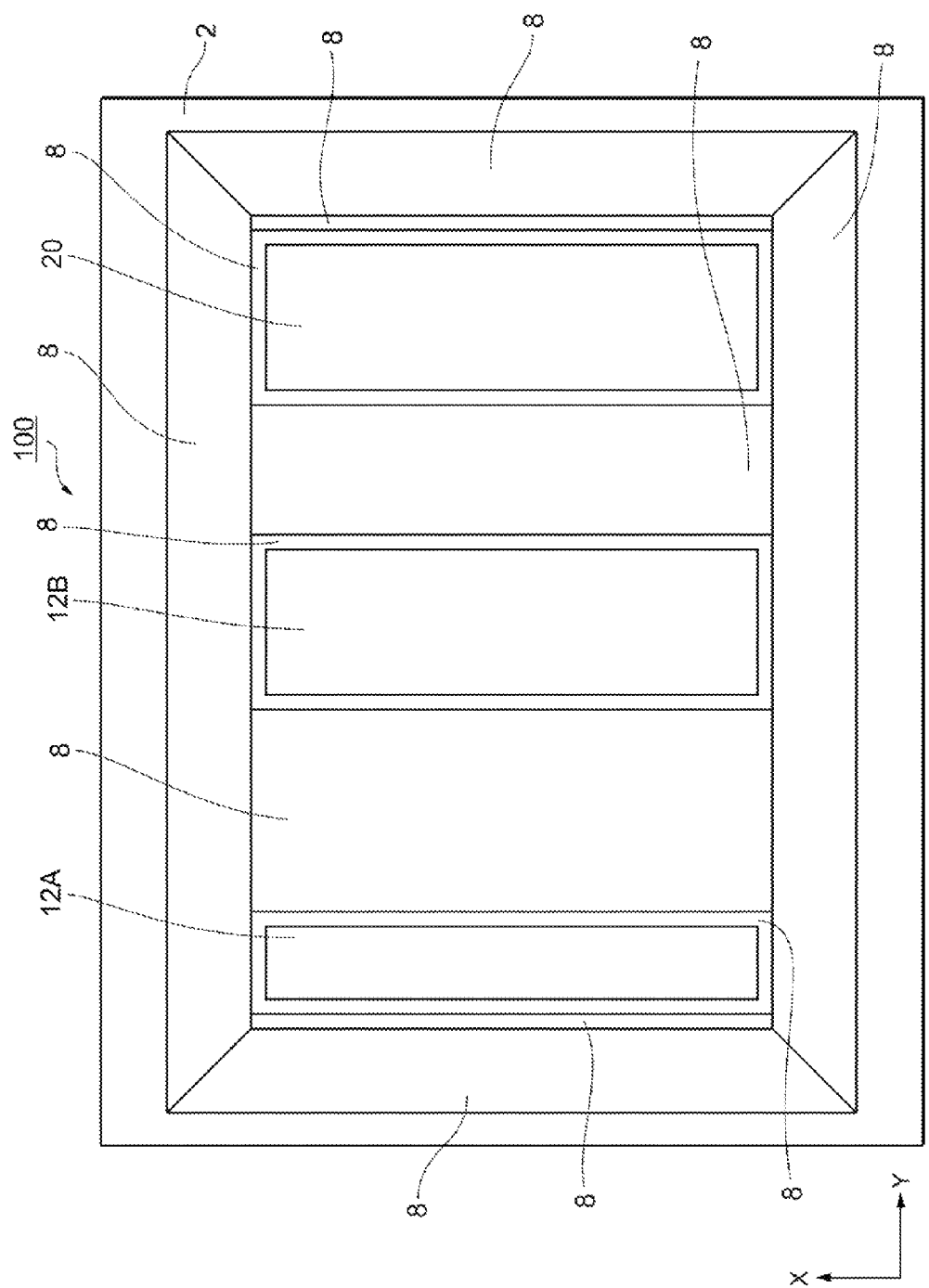

MAGNETORESISTIVE ELEMENT, SPIN MOSFET, MAGNETIC SENSOR, AND MAGNETIC HEAD

The present invention relates to a magnetoresistive element, a spin-MOSFET (spin-metallic oxide semiconductor field effect transistor), a magnetic sensor and a magnetic head.

BACKGROUND

A spin polarized current refers to a current which is applied with a degree of freedom of spin to the current caused by the charge, and is a current keeping a degree of freedom of charge and a degree of freedom of spin simultaneously. The magneto-resistance effect generated by allow the spin polarized current to flow between the ferromagnetic electrodes through a nonmagnetic layer is great and thus is referred to as giant magneto-resistance effect (GMR). Such an effect is applied to products such as a magnetic head and a sensor. In addition, it is well known that the effect generated in a configuration in which a tunnel film is used instead of a nonmagnetic layer is referred to as tunneling magneto-resistance effect (TMR), and a characteristic better than GMR can be obtained. These elements are passive elements in which outputs are generated based on a relative spinning angle between the ferromagnetic electrodes. Herein, the passive elements are used as the magnetoresistive elements. When the nonmagnetic layer is used as a semiconductor, there is an amplifying function in the semiconductor in addition to the magneto-resistance effect. Thus, active elements in spintronics have attracted attention. In Patent Documents 1 and 2, Spin-MOSFET is proposed in which magneto-resistance effect generated by spin polarized current flowing through a semiconductor is used.

It is known that there are two main factors for obtaining a giant magneto-resistance ratio in a structure where a nonmagnetic layer is sandwiched by two ferromagnetic layers. One is to increase the magneto-resistance caused by the spin of the ferromagnetic layers, thus increase the resistance. The other is to decrease the self-resistance of the element generating the magneto-resistance itself, in addition, the magneto-resistance ratio (MRR) is represented by $MRR=(R_{AP}-R_P)/R_P \times 100$, wherein, $R_{AP}$ is the resistance when the magnetization orientations of the 2 ferromagnetic layers are anti-parallel, and $R_P$ is the resistance when the magnetization orientations of the 2 ferromagnetic layers are parallel. Further, the magneto-resistance $\Delta R$ caused by spin is represented by the difference of $R_{AP}$ and $R_P$, i.e., $\Delta R = R_{AP} - R_P$. That is, it is known that a large magneto-resistance ratio can be obtained when $R_P$ is small and $R_{AP}$ is large.

Usually, the nonmagnetic layer plays an important role in the resistance of the element in the magnetoresistive elements. Generally, when GMR is used, a metal material is used in the nonmagnetic layer, thus the resistance of the element is small. In other words, the $R_P$ becomes small. Conversely, when TMR is used a tunnel insulating material is used in the nonmagnetic layer, thus the resistance of the element is large. That is, the $R_P$ is increased. However, it is known that a larger $\Delta R$ can be obtained in the case of TMR than in the case of GMR. As a result, it is known that a larger magneto-resistance ratio can be obtained in the case of TMR than in the case of GMR.

It will be more complex when the nonmagnetic layer is made of semiconductor material than in the case mentioned above. The reason is considered to be that the semiconductor material is a material which can transport spins easily and a larger $\Delta R$ can be obtained compared to the case when the nonmagnetic layer is made of metals. Additionally, when the nonmagnetic layer is made of a semiconductor material, the $R_P$ may also be smaller and a higher magneto-resistance ratio can be obtained compared to that when the nonmagnetic layer is made of a tunnel insulating, material. Also, when the nonmagnetic layer is made of a semiconductor material, the element may also be functioned as an active element.

As a method to decrease the resistance, it is considered to decrease the resistance of each layer. However, generally speaking, if the material is changed, the scattering caused by spin will change and the magneto-resistance ratio is not necessarily increased. In addition, when the path of the current flowing is in a sequence of the ferromagnetic layer, the tunnel layer, the semiconductor layer, the tunnel layer, and the ferromagnetic layer, a method of measuring the voltage between the interfaces of the semiconductor layer and the ferromagnetic layer is considered. However, according to the Non-Patent Document 2, the resistance in the entire circuit can be decreased to about a half by the method mentioned above, however, the output caused by spin will also decrease to a half, thus a problem is caused that the magneto-resistance ratio cannot be increased.

PATENT DOCUMENTS

Patent Document 1: WO2004/086625
Patent Document 2: JP-A-2006-32915
Patent Document 3: JP-A-2010-287666

NON-PATENT DOCUMENT

Non-Patent Document 1: T. Sasaki, T. Oikawa, T. Suzuki, M. Shiraishi, Y. Suzuki, and K. Noguchi, APPLIED PHYSICS LETTERS 98, 262503 (2011)
Non-Patent Document 2: T. Kimura, J. Hamrle, and Y. Otani, K. Tsukagoshi and Y. Aoyagi, APPLIED PHYSICS LETTERS 85 (2004) 3501
Non-Patent Document 3: B. Huang, D. J. Monsma and I. Appelbaum, PHYSICAL REVIEW LETTERS 99, 177209 (2007)
Non-Patent Document 4: A. Fert and H. Jaffrees, Physical Review B VOLUME 64, 184420 (2001)

SUMMARY

In order to obtain the magneto-resistance effect by using a semiconductor material in the nonmagnetic layer as described in the Non-Patent Document 1, it will be effective to insert a tunnel layer between the ferromagnetic layer and the semiconductor layer. Especially, when silicon which is a representative material of semiconductor is used in the semiconductor layer, an effective magneto-resistance effect produced by the method of inserting a tunnel layer between the ferromagnetic layer and the semiconductor layer can be obtained In the mentioned method, the current flows through a path of the ferromagnetic layer, the tunnel layer, the semiconductor layer, the tunnel layer and the ferromagnetic layer in order. Compared to the conventional GMR element or TMR element, the resistance of this element becomes large because 2 layers of the tunnel layers with the highest resistance are contained. Thus, it is difficult to obtain a large in magneto-resistance ratio.

In order to solve the problem, there is a method of removing the tunnel layer so as to directly bond the semiconductor layer and the ferromagnetic layer. In this case, there will be an effect that the spin which is introduced into the semiconductor layer will return to the ferromagnetic layer side. Thus, it will be difficult to obtain a large magneto-resistance effect.

A large output can be expected to be obtained if the impurities in the semiconductor layer are reduced and the resistance of the semiconductor layer is increased in order to produce a large spin accumulation. Even in this case, the resistance of the circuit will be increased due to the increasing of the resistance of the semiconductor layer, thus, it is difficult to obtain a large magneto-resistance ratio.

In order to solve the problems, it is necessary to find a method in which the interface resistance between the semiconductor layer and the tunnel layer and the resistance of the semiconductor layer produce as little influence as possible on the magneto-resistance ratio. However, in the ordinarily used element using a semiconductor material in the non-magnetic layer with the magneto-resistance effect, the mentioned problem cannot be solved.

In order to solve the technical problem mentioned above, the magnetoresistive element of the present invention is characterized in comprising a semiconductor channel layer, a first ferromagnetic layer disposed on the semiconductor channel layer, a second ferromagnetic layer disposed away front the first ferromagnetic layer on the semiconductor channel layer, and a first reference electrode disposed away from the first ferromagnetic layer and the second ferromagnetic layer on the semiconductor channel layer, wherein current is input from the second ferromagnetic layer to the first ferromagnetic layer through the semiconductor channel layer, and the voltage between the second ferromagnetic layer and the first reference electrode is output. By the characteristics, only the change of the resistance between the second ferromagnetic layer and the semiconductor channel layer can be extracted When the voltage between the first ferromagnetic layer and the second ferromagnetic layer is measured, the voltage containing the voltage drop can be measured, in which the voltage drop is produced by the resistance of the semiconductor channel layer between the first ferromagnetic layer and the second ferromagnetic layer or the resistance of the interface between the first ferromagnetic layer and the semiconductor channel layer. In the magnetoresistive element of the present invention, a high magneto-resistance ratio can be obtained relative to the decreased part of the element resistance corresponding to the measured voltage which can be observed.

Further, the magnetoresistive element of the present invention is characterized in that, it comprises at least one selected from a first tunnel layer and a second tunnel layer, wherein, the first tunnel layer is disposed between the first ferromagnetic layer and the semiconductor channel layer and the second tunnel layer is disposed between the second ferromagnetic layer and the semiconductor channel layer. The resistance between the ferromagnetic layer and the semiconductor channel layer can be adjusted to obtain an optimal magneto-resistance ratio by disposing a tunnel layer between the ferromagnetic layer and the semiconductor channel layer.

Additionally, the magnetoresistive element of the present invention is characterized in that it comprises both the first tunnel layer and the second tunnel layer. The resistance between the ferromagnetic layer and the semiconductor channel layer can be adjusted to obtain a suitable magneto-resistance ratio by containing both of the two layers.

Further, the magnetoresistive element of the present invention is characterized in that the distance between the first ferromagnetic layer and the second ferromagnetic layer is shorter than the spin transport distance in the semiconductor channel layer. The distance between the first ferromagnetic layer and the second ferromagnetic layer refers to the distance between the nearest parts separated by the semiconductor channel layer. The electron conducting between the first ferromagnetic layer and the second ferromagnetic layer is transported in the shortest distance between the first ferromagnetic layer and the second ferromagnetic layer via the semiconductor channel layer. Thus, if the spin transport distance of the semiconductor channel layer is at least longer than the shortest distance, the spin polarized current flowing between the first ferromagnetic layer and the second ferromagnetic layer can be conducted in the distance between the first ferromagnetic layer and the second ferromagnetic layer with the information of the spin being stored.

Further, the magnetoresistive element of the present invention is characterized in that the second ferromagnetic layer is disposed between the first ferromagnetic layer and the first reference electrode. By this construction, the resistance of the semiconductor channel layer can be ignored.

Further, the magnetoresistive element of the present invention is characterized in that the coercivity of the second ferromagnetic layer is different from the coercivity of the first ferromagnetic layer. By the difference in the coercivity, the magnetization orientation of the first ferromagnetic layer and the magnetization orientation of the second ferromagnetic layer can be made different easily, different resistances corresponding to the relative angle of different magnetization orientations can be obtained, and this can be stored as information. Additionally, when the coercivity of the second ferromagnetic layer is larger than the coercivity of the first ferromagnetic layer, the magnetization orientation of the first ferromagnetic layer relative to the second ferromagnetic layer may be measured as the resistance between the second ferromagnetic layer and the semiconductor channel layer. Thus, the strength of the external magnetic field applied to the element can be measured.

Further, the magnetoresistive element of the present invention is characterized in that the semiconductor channel layer comprises any one selected from the group consisting of Si, Ge, SiGe, GaAs, InAs, SiC Graphene, Graphite and Silicene. Additionally, the semiconductor channel layer is preferred to contain any one of the above materials as a main component. A main component means that the component accounts for 50% or more of the elements functioned as the semiconductor channel layer. These materials have a long spin lifetime, thus, spin transport with a long distance and a high magneto-resistance output can be obtained. further, these materials can be produced by introducing well-known materials in industry into a conventional instrument directly.

Further, the magnetoresistive element of the present invention is characterized in that the semiconductor channel layer comprises a PEDOT:PSS (PEDOT (polyethylene dioxy thiophene) and poly anion poly(styrene sulfonate)). The PEDOT:PSS has a long spin lifetime, thus, a spin transport with a long distance and. a high magneto-resistance output can be obtained. Further, the PEDOT:PSS can be formed by coating, thus it can form an element on a flexible substrate or a curved surface or the like. The conventional semiconductor substrate may have a weak three such as a bending force, However, as for the present material, a semiconductor channel layer may be formed on a flexible substrate or a part other than a plane. Thus, an element which will not be damaged even When it is bent with a low cost and a low environmental impact can be formed. Additionally, the present material can be used in a display because of the transparency and further it can store image under low power consumption because of the non-volatile information storage based on the ferromagnetic layer.

Further, the magnetoresistive element of the present invention is characterized in that the semiconductor channel layer has a structure with a longitudinal structure and a latitudinal structure connected in a T shape, the second ferromagnetic layer is disposed on the connecting part of the, longitudinal structure and the latitudinal structure, the first ferromagnetic layer is disposed on the latitudinal structure away from the second ferromagnetic layer, and the first reference electrode is disposed an the longitudinal structure away from the second ferromagnetic layer. The backfire of the spin flow may be suppressed and a high output can be obtained by constructing the semiconductor channel layer in a T shape. The backfire of the spin flow refers to the phenomenon that the spin-flow flows in a direction opposite to the flowing direction of the spin polarized current which is provided by applying the information of the spin on the electron, and the spin polarization ratio of the spin polarized current is decreased by that extent.

Further, the magnetoresistive element of the present invention is characterized in that it further comprises a MOSFET, wherein the second ferromagnetic layer is electrically connected with the gate electrode of the MOSFET, the first reference electrode is electrically connected with the source electrode of the MOSFET, and the voltage between the second ferromagnetic layer and the first reference electrode is amplified by the MOSFET. The magnetoresistive element of the present invention can be used as an element with a large output by using the amplification function of the MOSFET, The spin-MOSFET of the present invention is characterized that it uses the magnetoresistive element mentioned above.

The magnetic sensor of the present invention is characterized in that it uses the magnetoresistive element mentioned above.

The magnetic head of the present invention is characterized in that it uses the magnetoresistive element mentioned above.

Additionally, in the present specification, the resistance $R_P$ of the magnetoresistive element is referred to as 'element resistance', which is measured when the magnetization orientations of the first ferromagnetic layer and the second ferromagnetic layer are parallel. Further, when the resistance of the magnetoresistive element measured When the magnetization orientation of the first ferromagnetic layer is anti-parallel to that of the second ferromagnetic layer is taken as $R_{AP}$, the difference of $R_{AP}$ and $R_P$, i.e., $\Delta R = R_{AP} - R_P$, is referred to as 'magneto-resistance'.

According to the present invention, a magnetoresistive element with a higher magneto-resistance ratio than the conventional magnetoresistive element using a semiconductor channel layer, a spin-MOSFET, a magnetic sensor and a magnetic head using this magnetoresistive element can be provided.

BRIEF DESCRIPTION OF THE DRAWINGS

FIG. 2 is a view showing the magnetoresistive element of FIG. 1A when it is viewed in the Z-axis direction.

DETAILED DESCRIPTION OF EMBODIMENTS

Hereinafter, embodiments of the present invention will be described in detail with reference to the drawings. The following description illustrates part of embodiments in the present invention, and the present invention is not limited to these embodiments. The embodiments involving the technical concept of the present invention will necessarily fall within the scope of the present invention. The configurations in each embodiment and the combination thereof are only examples of the present invention. The constituent element can be added, omitted, substituted or subject to other modifications without departing front the spirit and the scope of the present invention. Further, the same reference refers to the same element throughout the description to the drawings, and repeated description will be omitted.

First Embodiment

Figure 1A:
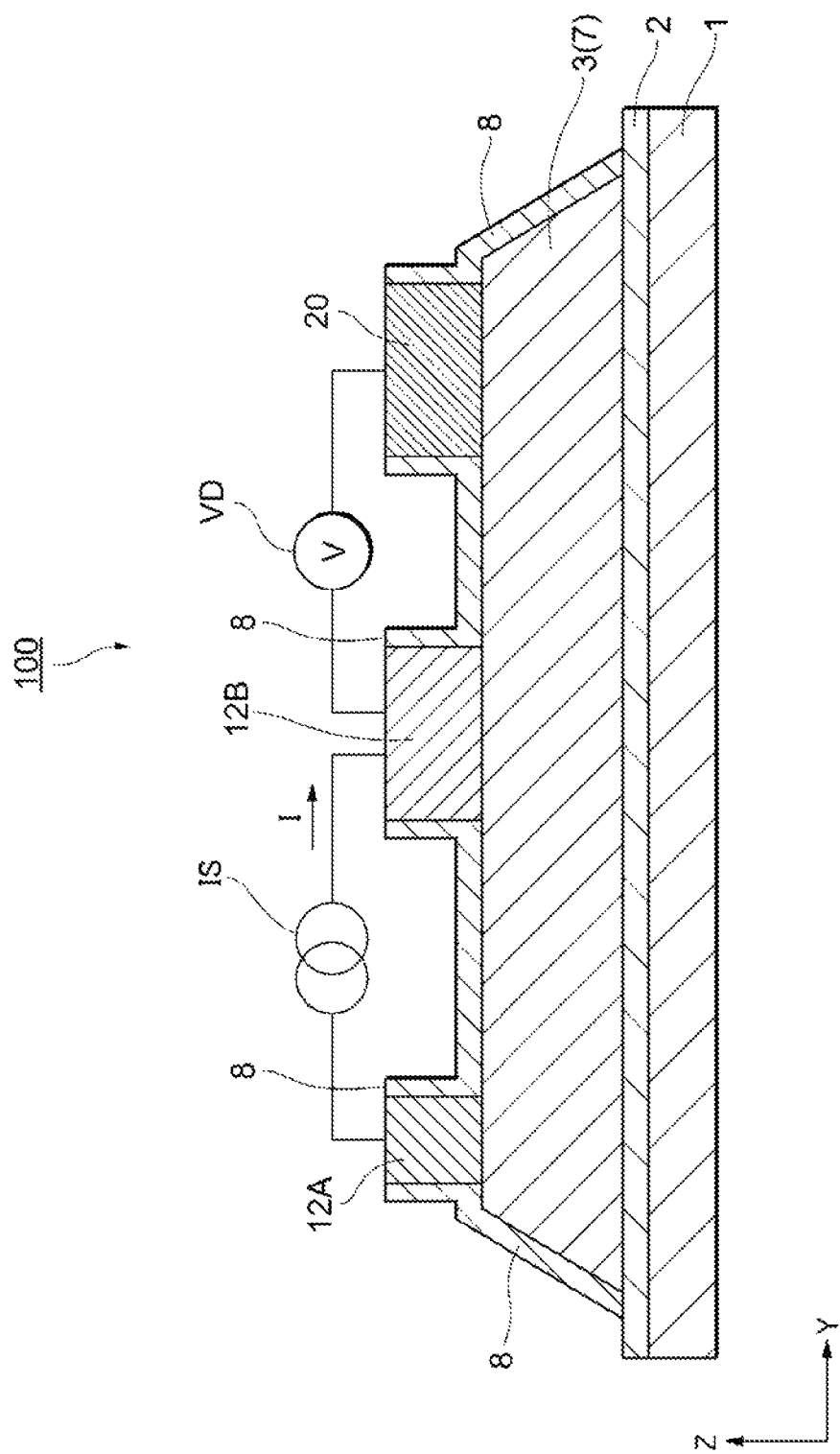
FIG. 1A is a cross-sectional view showing the magnetoresistive element according to the first embodiment.

FIG. 1A is a cross-sectional view showing magnetoresistive element according to the first embodiment.

When silicon is used as the material of semiconductor channel layer 3, magnetoresistive element 100 is provided with silicon substrate 1, silicon oxide layer 2, and silicon channel layer 7 functioning as semiconductor channel layer 3. Silicon oxide film 2 and silicon channel layer 7 are disposed on silicon substrate 1 in order. As shown in FIG. 1A, the side walls of silicon channel layer 7 incline, and the surface of silicon channel layer 7 is covered by insulating layer 8. The inclining angle θ of the side wall of silicon channel layer 7 is 50 degree to 60 degree. Herein, the inclining angle θ refers to the angle formed by the bottom and the side wall of silicon channel layer 7. Additionally, silicon channel layer 7 can be formed by wet etching, and the top surface of silicon channel layer 7 is preferably the (100) plane. The substrate such as the SOI (Silicon On Insulator) substrate can be used in silicon substrate 1, silicon oxide film 2 and silicon channel layer 7. In addition, magnetoresistive element 100 has first ferromagnetic layer 12A, second ferromagnetic layer 12B and first reference electrode 20 on the top surface of silicon channel layer 7. And the surface of the part on silicon channel layer 7 without first ferromagnetic layer 12A, second ferromagnetic layer 12B or first reference electrode 20 is covered by insulating layer 8. In addition, the side walls of first ferromagnetic layer 12A, second ferromagnetic layer 12B and first reference electrode 20 are covered by insulating layer 8.

By insulating layer 8, first ferromagnetic layer 12A, second ferromagnetic layer 12B can be protected from deteriorating caused by oxidation. Insulating layer 8 can be a silicon oxide film. The silicon oxide film is proper to be used as a protecting film. In addition, the silicon oxide film can be easily manufactured on silicon channel layer 7 made of silicon.

Current source IS is disposed between first ferromagnetic layer 12A and second ferromagnetic layer 12B. The current is input into first ferromagnetic layer 12A from second ferromagnetic layer 12B through silicon channel layer 7. Voltage meter VD is disposed between second ferromagnetic layer 12B and first reference electrode 20. Magnetoresistive element 100 outputs the voltage between second ferromagnetic layer 12B and first reference electrode 20.

Silicon channel layer 7 functions as a layer where the spin is transported. Impurities are provided in silicon channel layer 7 to provide an identical type of conductivity, and the entire silicon channel layer 7 is of the same conductivity type. For instance, when silicon channel layer 7 is set as of p type, the impurity can be B, Al, Ga, In and the like. When silicon channel layer 7 is set as of n type, the impurity can be P, As, Sb and the like.

First ferromagnetic layer 12A and second ferromagnetic layer 12B are made of the ferromagnetic material. As the material for first ferromagnetic layer 12A and second ferromagnetic layer 12B, for instance, the metal selected from the group consisting of Ti, V, Cr, Mn, Co, Fe and Ni, the alloy containing at least one of said elements, or the alloy containing at least one element selected from said group and at least one element selected from the group consisting of B, C and N can be listed. As these materials are soft magnetic material, they can properly function as second ferromagnetic layer 12B. In addition, as these materials are ferromagnetic materials with a high spin polarization ratio, they can properly function as first ferromagnetic layer 12A.

First reference electrode 20 is made of non-magnetic material. As the material for first reference electrode 20, materials which have a similar work function with silicon channel layer 7 such as aluminum or the like are preferred. By using a non-magnetic material with a similar work function, the Schottky barrier produced by the bonding of first reference electrode 20 and silicon channel layer 7 can be narrowed, and the resistance of the interface between first reference electrode 20 and silicon channel layer 7 can be decreased.

FIG. 2 is a view showing the magnetoresistive element of FIG. 1A when it is viewed in the Z-axis direction, it shows a state that silicon channel layer 7 covered by insulating layer 8 is isolated on silicon oxide film 2. In addition, silicon channel layer 7 can be electrically connected through first ferromagnetic layer 12A, second ferromagnetic layer 12B and first reference electrode 20.

In magnetoresistive element 100 of the present invention, the same part of the path the current flowing and, the path for measuring the voltage is second ferromagnetic layer 12B and the part of silicon channel layer 7 in the vicinity of the interface under second ferromagnetic layer 12B. In the spin polarized current relating to GMR effect or TMR effect, the scattering of spin is considered to be generated at the interface between the ferromagnetic layer and the nonmagnetic layer (the tunnel layer is contained). In magnetoresistive element 100, current is applied between the first ferromagnetic layer 12A. and second ferromagnetic layer 12B through silicon channel layer 7, and magnetoresistive element 100 is a device using the spin polarized current in which spin polarization is caused by the ferromagnetic layer. Therefore, magnetoresistive element 100 is an element in which magneto-resistance effect is caused between first ferromagnetic layer 12A and second ferromagnetic layer 12B, and the change of the resistance between second ferromagnetic layer 12B and silicon channel layer 7 (in the vicinity of the interface between second ferromagnetic layer 12B and silicon channel layer 7) is measured as voltage.

The distance between first ferromagnetic layer 12A and second ferromagnetic layer 12B is preferred to be shorter than the spin transport distance in silicon channel layer 7. The spin transport distance refers to the standard of the transport distance of the spin information in the spin polarized current obtained by addition of spin information to the charge. That is, spin transport distance refers to the distance between. ferromagnetic electrodes when the measured change amount of the output voltage is decreased to a half based on the output voltage when the distance between ferromagnetic electrodes (distance between first ferromagnetic layer 12A and second ferromagnetic layer 12B) is 0, wherein, the measured change amount of the output voltage corresponds to the magneto-resistance accompanying with the magnetic reversal in the ferromagnetic layer. For example, in the case of a pure spin current, the spin output ΔV which is the change amount of the output voltage can be represented as follows.

$$\Delta V = \frac{P^2 \lambda_N}{\sigma A} I \exp\left(-\frac{d}{\lambda_N}\right)$$

P is the spin polarization) in the interface between silicon channel layer 7 and first ferromagnetic layer 12A and the interface between silicon channel layer 7 and second. ferromagnetic layer 12B; $\lambda_N$ is the spin diffusing length; σ is the electrical conductivity of silicon channel layer 7; A is the cross-sectional area of silicon channel layer 7; I is the current; and d is the distance between the ferromagnetic electrodes. In the case of the spin polarized current, the spin output ΔV can be represented in a form with the effect of the electrical field being considered. For example, in Non-Patent Document 3, the effect of the electrical field using the spin polarized current of hot electron which is similar to the present invention is described. In the case of using the spin polarized current, the distance between the ferromagnetic electrodes refers to the distance of the nearest path in semiconductor channel layer 7 between first ferromagnetic layer 12A and second ferromagnetic layer 12B. The electron conducted between first ferromagnetic layer 12A and second ferromagnetic layer 12B is transported in the shortest distance between first ferromagnetic layer 12A and second ferromagnetic layer 12B through silicon channel layer 7. Thus, if the spin transport distance of silicon channel layer 7 is at least longer than the shortest distance, the spin polarized current flowing between first ferromagnetic layer 12A and second ferromagnetic layer 12B can be conducted in the distance between first ferromagnetic layer 12A and second ferromagnetic layer 12B with the spin information kept.

In magnetoresistive element 100, second ferromagnetic layer 12A is disposed between first ferromagnetic layer 12B and first reference electrode 20. By disposing second ferromagnetic layer 12B between first ferromagnetic layer 12A and first reference electrode 20, the change of the resistance between silicon channel layer 7 and second ferromagnetic layer 12B (the interface between silicon channel layer 7 and second ferromagnetic layer 12B) can be mainly measured in magnetoresistive element 100. With this arrangement, the resistance of silicon channel layer 7 can be ignored.

In magnetoresistive element 100, the coercivity of second ferromagnetic layer 12B is lower than that of first ferromagnetic layer 12A. As shown in FIG. 2, silicon channel layer 7 has a cuboid shape with the Y direction as the long axis. Additionally, silicon channel layer 7 may also be a substantially cuboid shape. Generally, it is difficult to form a strict right angle by a photo process or the like, thus the shape is a little rounded. In order to form a shape more right-angled, a method of adding special shapes even to the angles of the photoresist is also known. First ferromagnetic layer 12A and second ferromagnetic layer 12B have a cuboid shape with the X direction as the long axis respectively. In magnetoresistive element 100, the width in the Y direction of second ferromagnetic layer 12B is larger than that of first ferromagnetic layer 12A. Difference is provided in reversal magnetic field based on the difference in the aspect ratios of the X direction and the Y direction between first ferromagnetic layer 12A and second ferromagnetic layer 12B. In this way, difference in coercivity is provided due to the magnetic anisotropy caused by shape between first ferromagnetic layer 12A and second ferromagnetic layer 12B, and the coercivity of first ferromagnetic layer 12A is larger than that of second ferromagnetic layer 12B. Further, the area of the interface between second ferromagnetic layer 12B and silicon channel layer 7 wherein the voltage is measured. is larger than the area of the interface between first ferromagnetic layer 12A and silicon channel layer 7. Thus, the resistance of the interface between second ferromagnetic layer 12B and silicon channel layer 7 is smaller than the resistance of the interface between first ferromagnetic layer 12A and silicon channel layer 7. Additionally, the current density in the interface between second ferromagnetic layer 12B and silicon channel layer 7 is smaller than that in the interface between first ferromagnetic layer 12A and silicon channel layer 7, thus the magneto-resistance effect relative to the current becomes large. Accordingly, the interface resistance between second ferromagnetic layer 12B and silicon channel layer 7 decreases, and the spin output increases, thus a larger magneto-resistance ratio than that of the conventional magnetoresistive elements can be obtained.

For example, antiferromagnetic layer may further comprised on first fen-magnetic layer 12A, rather than providing difference in coercivity based on the magnetic anisotropy caused by shape between first ferromagnetic layer 12A and second ferromagnetic layer 12B. The antiferromagnetic layer functions as a layer to fix the magnetization orientation of first ferromagnetic layer 12A. Unidirectional anisotropy can be provided in the magnetization orientation of first ferromagnetic layer 12A by the exchange coupling of the antiferromagnetic layer with first ferromagnetic layer 12A. In this case, first ferromagnetic layer 12A can be obtained with a higher coercivity in one direction than in the case without an antiferromagnetic layer. The material used in the antiferromagnetic layer can be selected based on the material used in first ferromagnetic layer 12A. For example, as the antiferromagnetic layer, alloy showing antiferromagnetism using Mn, specifically, alloy containing Mn and at least one element selected from Pt, Ir, Fe, Ru, Cr, Pd, and Ni can be listed. Specifically, for example, IrMn and PtMn can be listed. Additionally, the coercivity of second ferromagnetic layer 12B can also be larger than that of first ferromagnetic layer 12A by providing an antiferromagnetic layer on second ferromagnetic layer 12B rather than providing an antiferromagnetic layer on first ferromagnetic layer 12A.

The current flows between first ferromagnetic layer 12A and second ferromagnetic layer 12B through silicon channel layer 7, and the magneto-resistance effect can be measured based on the relative angle of the magnetization orientations of first ferromagnetic layer 12A and second ferromagnetic layer 12B. Difference can be easily provided to the magnetization orientation of first ferromagnetic layer 12A and the magnetization orientation of second ferromagnetic layer 12B when the coercivity of second ferromagnetic layer 12B is different from the coercivity of first ferromagnetic layer 12A. Thus, resistance values corresponding to relative angles of the magnetization orientations can be obtained respectively, which can be kept as information. In addition, when the coercivity of second ferromagnetic layer 12B is larger than the coercivity of first ferromagnetic layer 12A, the magnetization orientation of first ferromagnetic layer 12A can be measured as the resistance between second ferromagnetic layer 12B and silicon channel layer 7, with second ferromagnetic layer 12B as the reference, thus, the strength of the external magnetic field applied on the element can be measured.

In the present embodiment, silicon is used as material of semiconductor channel layer 3. However, the material of semiconductor channel layer 3 is not limited to silicon. For example, as the material of semiconductor channel layer 3, it is preferred to contain any one selected from the group consisting of Ge, SiGe, GaAs, InAs, SiC, Graphene, Graphite and Silicene. Additionally, semiconductor channel layer 3 is preferred to contain any one of the above materials as a main component. A main component means that the component accounts for 50% or more of the elements functioned as the semiconductor channel layer. These materials have a long spin lifetime, thus, spin transport with a long distance and a high magneto-resistance output can be obtained. Further, these materials can be produced by introducing well-known materials in industry into a conventional instrument directly.

Semiconductor channel layer 3 is preferred to contain a PEDOT:PSS (PEDOT (polyethylene dioxy thiophene) and poly anion poly(styrene sultanate)). The PEDOT:PSS has a long spin lifetime, thus, a spin transport with a long distance and a high magneto-resistance output can be obtained. Further, the PEDOT: PSS can be thrilled by coating, thus it can form an element on a flexible substrate or a curved surface or the like. The conventional semiconductor substrate has a weak force such as a bending three. However, as for the present material, a semiconductor channel layer 3 can be formed on a flexible substrate or a part other than a plane. Thus, an element which will not be damaged even when it is bent with a low cost and a low environmental impact can be formed. Additionally, the present material can be used in a display because of the transparency, and further it can store image under low power consumption because of the nonvolatile information storage based on the ferromagnetic layer.

Magnetoresistive element 100 is applicable in spin-MOSFETs, spin transistors, memories, logical circuits or the like. Preferably, it is a spin-MOSFET. The Spin-MOSFET refers to a device in which the ferromagnetic material is used in the source electrode and the drain electrode of the MOSFET, and the element resistance changes as the relative angle formed by the magnetization orientation of the ferromagnetic material for the source electrode and that of the ferromagnetic material for the drain electrode changes. The most outstanding characteristic of the Spin-MOSFET is the nonvolatile information storage corresponding to the magnetization states of the source electrode and the drain electrode and the output property that regeneration is possible. Especially, a new architecture can be provided in which static power can be reduced to a large extent, wherein the static power is one of the important problems in the CMOS integrated circuit.

Figure 1B:
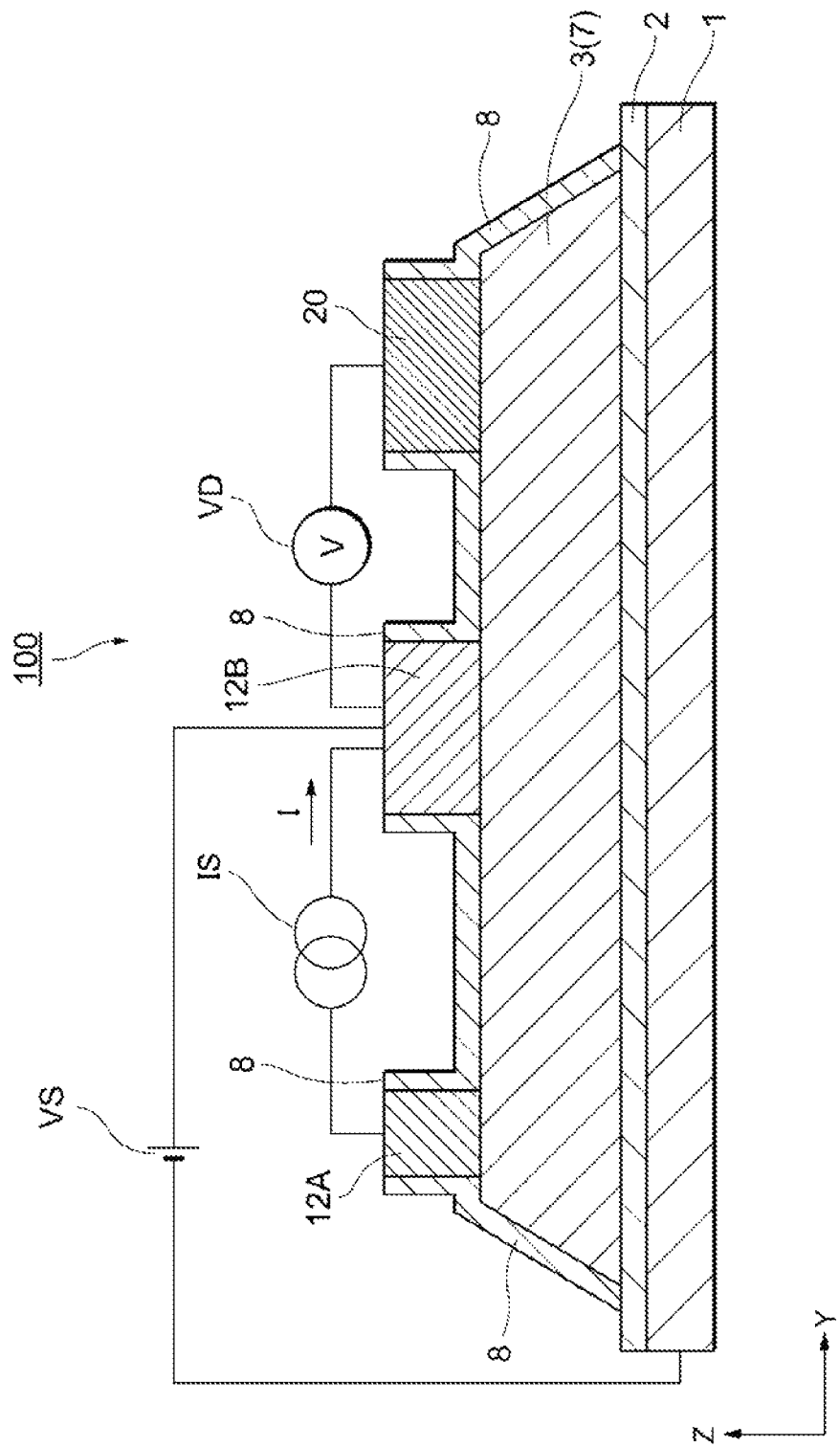
FIG. 1B is a cross-sectional view showing the case when the magnetoresistive element according to the first embodiment is used as a spin-MOSFET.

Hereinafter, one example of the case using magnetoresistive element 100 as the spin-MOSFET is described. First ferromagnetic layer 12A is used as the source electrode, second ferromagnetic layer 12B is used as the drain electrode and silicon substrate 1 is used as the gate electrode. As shown in FIG. 1B, a voltage source VS is connected between silicon substrate 1 and second ferromagnetic layer 12B, and a gate voltage is applied to silicon channel layer through silicon dioxide film 2 and second ferromagnetic layer 12B. Thereby, magnetoresistive element 100 can be functioned as a MOSFET.

The method for applying a gate voltage to silicon channel layer 7 is not limited to the mentioned method instead of using silicon substrate a as the gate electrode, a gate electrode (top gate electrode) may also provided on the top of silicon channel layer 7 to apply a gate voltage to silicon channel layer 7.

Hereinafter, the action of magnetoresistive element 100 is described. Current source IS is disposed so that the current can flow through silicon channel layer 7 between Fast ferromagnetic layer 12A and second ferromagnetic layer 12B as shown in FIG. 1A and FIG. 2. Voltage meter VD is disposed between second ferromagnetic layer 12B and first reference electrode 20. The electrons flow from first ferromagnetic layer 12A which is ferromagnetic to silicon channel layer 7 which is non-magnetic and further flow into second ferromagnetic layer 12B. The injected electrons turn into the spin polarized current keeping the spin information corresponding to the magnetization orientation of first ferromagnetic layer 12A, and reach second ferromagnetic layer 12B by transporting in silicon charnel layer 7. The spin output as the voltage change can be obtained by measuring the voltage between second ferromagnetic layer 12B and first reference electrode 20, wherein the voltage change correspond to the change of the relative angle of the magnetization orientation of second ferromagnetic layer 12B and the spin orientation of the spin polarized current. In this case, the obtained spin output is the same as the spin output when the voltage change between first ferromagnetic layer 12A and second ferromagnetic layer 12B is measured. However, the measured voltage is a voltage without the voltage drop caused by the resistance of silicon channel layer 7 or the resistance of the interface between first ferromagnetic layer 12A and silicon channel layer 7. As a result, when the voltage between first ferromagnetic layer 12A and second ferromagnetic layer 12B is measured, the voltage containing the voltage drop caused by the resistance of silicon channel layer 7 between first ferromagnetic layer 12A and second ferromagnetic layer 12B or the resistance of the interface between first ferromagnetic layer 12A and silicon channel layer 7 is measured. However, compared to that case, in magnetoresistive element 100, a higher magneto-resistance ratio can be obtained relative to the decreased part of the element: resistance corresponding to the measured voltage which can be observed. As shown in Non-Patent Document 2, when the material of semiconductor channel layer 7 is metal, this kind of effect cannot be observed.

Second Embodiment

Figure 3:
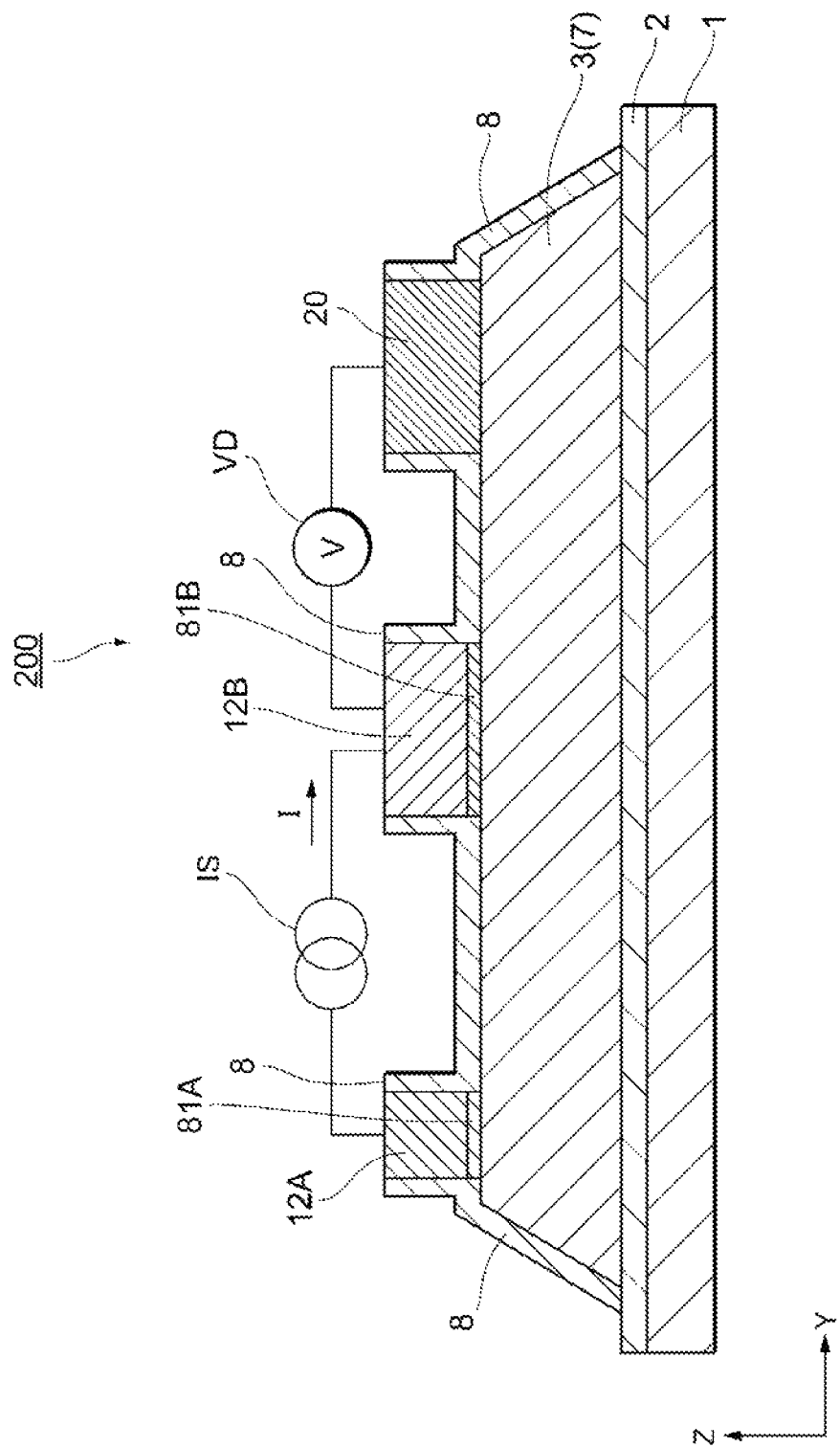
FIG. 3 is a cross-sectional view showing the magnetoresistive element according to the second embodiment.

Concerning magnetoresistive element 200 of the second embodiment of the present invention, portions different from magnetoresistive element 100 of the first embodiment will be described. To the portion with the same structure as magnetoresistive element 100 of the first embodiment, the same reference is used and description is omitted properly. FIG. 3 is a cross-sectional view showing magnetoresistive element 200 according to the second embodiment. Magnetoresistive element 200 is an element with a tunnel layer disposed in magnetoresistive element 100 of the first embodiment. First tunnel layer 81A is disposed between first ferromagnetic layer 12A and silicon channel layer 7; and second tunnel layer 81B is disposed between second ferromagnetic layer 12B and silicon channel layer 7.

It is preferred to insert first tunnel layer 81A between first ferromagnetic layer 12A and silicon channel layer 7, and insert second tunnel layer 81B between second ferromagnetic layer 12B and silicon channel layer 7. However, it may also be a configuration that any one of first tunnel layer 81A or second tunnel layer 81B is inserted.

From the viewpoint, of suppressing the increase of the resistance and functioning as a tunnel insulating layer, the thicknesses of first tunnel layer 81A and second tunnel layer 81B are preferred to be 3 nm, or less. From the viewpoint of functioning as a tunnel insulating layer, considering the thickness of one atom layer, the thicknesses of first tunnel layer 81A and second tunnel layer 81B are preferred to be 0.4 nm or more. As the material of first tunnel layer 81A and second tunnel layer 81B, for example, magnesium oxide can be used. The spin injection efficiency will be improved by using magnesium oxide in the material of first tunnel layer 81A and second, tunnel layer 81B. The reason is that the magneto-resistance effect is extraordinarily high when the spin filter effect of a tunnel layer with single crystal is used. When the material of semiconductor channel layer 3 is silicon, magnesium oxide or non-magnetic spinel oxide film is preferred to be used as the material of first tunnel layer 81A and second tunnel layer 81B. The resistance between the ferromagnetic layer and the semiconductor channel layer can be adjusted and a proper magneto-resistance ratio can be obtained, by disposing a tunnel layer between the ferromagnetic layer and the semiconductor channel layer.

Third Embodiment

Figure 4:
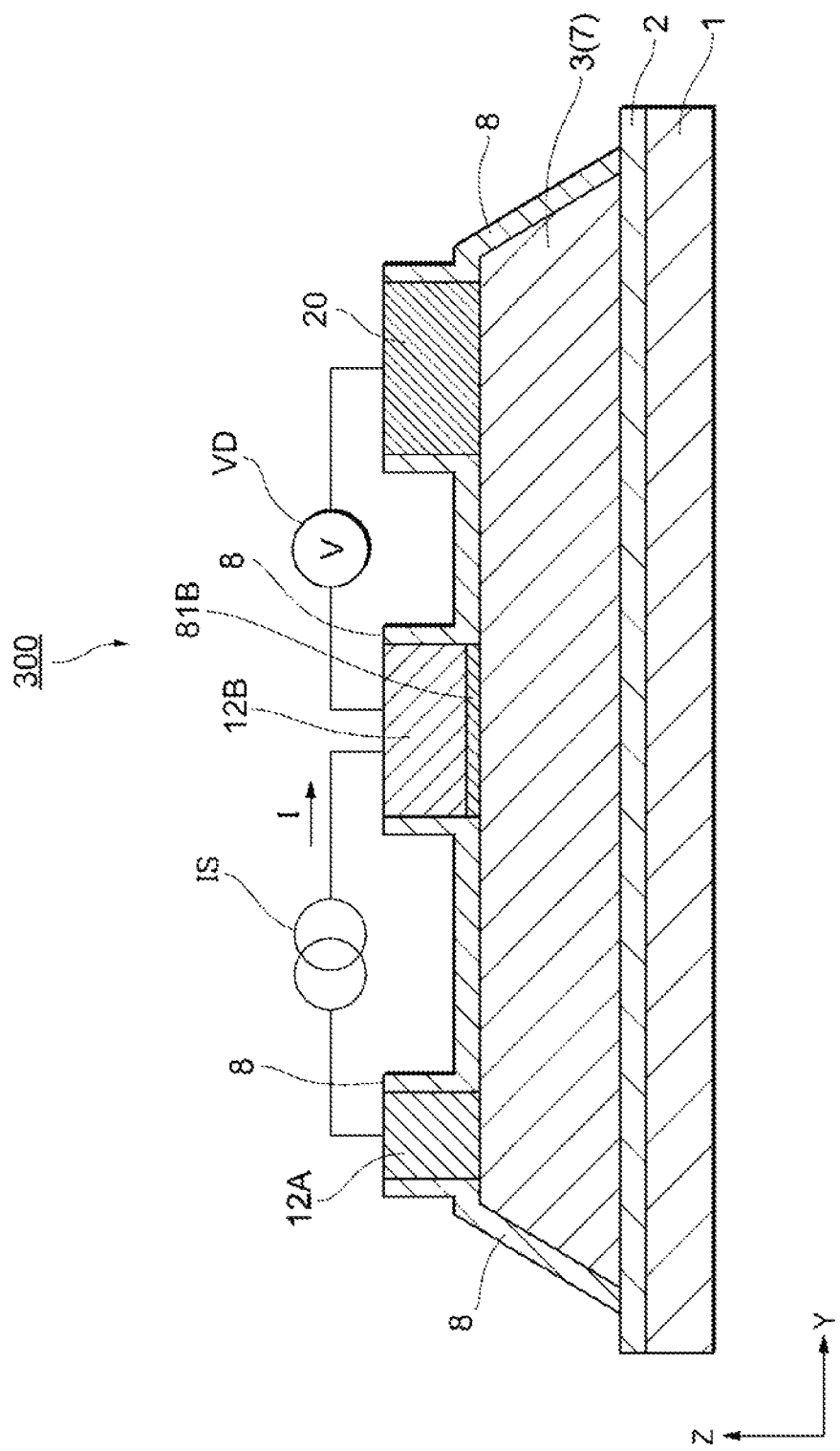
FIG. 4 is a cross-sectional view showing the magnetoresistive element according to the third embodiment.

As to magnetoresistive element 300 of the third embodiment of the present invention, portions different from magnetoresistive element 100 of the first embodiment will be described. To the portion with the same structure as magnetoresistive element 100 of the first embodiment, same reference is used and description is omitted properly. FIG. 4 is a cross-sectional view showing the magnetoresistive element 300 according to the third embodiment. Magnetoresistive element 300 is an element with a tunnel layer disposed in magnetoresistive element 100 of the first embodiment. Second tunnel layer 81B is disposed between second ferromagnetic layer 12B and silicon channel layer 7 while nothing is disposed between first ferromagnetic layer 12A and silicon channel layer 7. In magnetoresistive element 300, spin polarized current passes the tunnel layer once. The terminal where the voltage is output: is the same as magnetoresistive element 200 of the second embodiment, but in magnetoresistive element 300, the resistance of the path the spin polarized current flows decreases by a level related to first tunnel layer 81A. As Johnson noise is generated in proportion to the circuit resistance, noise in magnetoresistive element 300 is lower than that in magnetoresistive element 200 of the second embodiment.

Fourth Embodiment

Figure 5:
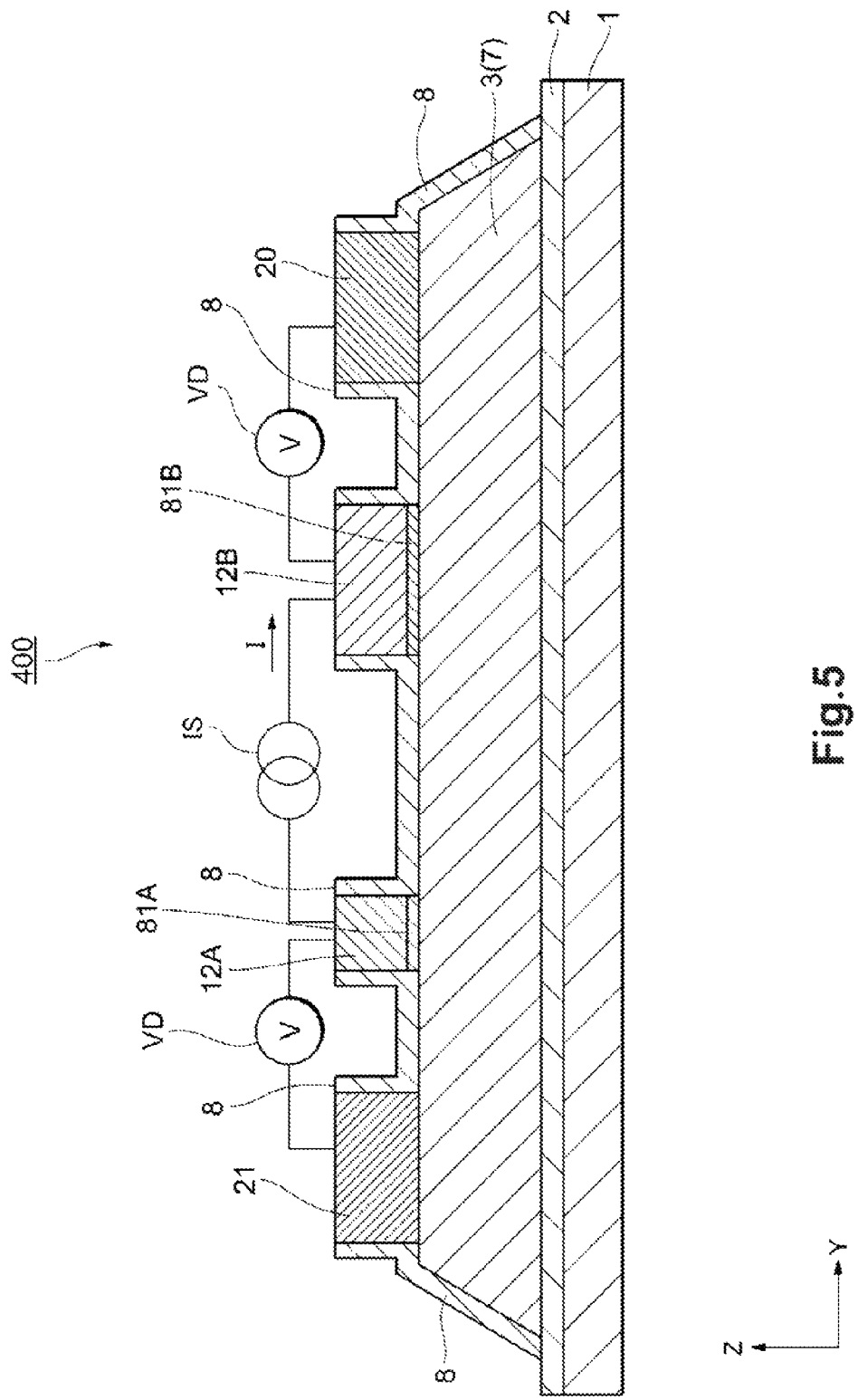
FIG. 5 is a cross-sectional view showing the magnetoresistive element according to the fourth embodiment.

As to magnetoresistive element 400 of the fourth embodiment of the present invention, portions different from magnetoresistive element 200 of the second embodiment will be described. To the portion with the same structure as magnetoresistive element 200 of the second embodiment, same reference is used and description is omitted properly. FIG. 5 is a cross-sectional view showing the magnetoresistive element 400 according to the fourth embodiment. Magnetoresistive element 400 is an element with second reference electrode 21 disposed in magnetoresistive element 200 of the second embodiment. Second reference electrode 21 is made of a non-magnetic material and the same material as that used in first reference electrode 20 can be used. Magnetoresistive element 400 is an element to which several evaluations can be performed besides the evaluation on the magneto-resistance effect of first ferromagnetic layer 12A and second ferromagnetic layer 12B through silicon channel layer 7.

One of the possible evaluations is the measurement of general magneto-resistance, if current is input between first ferromagnetic layer 12A and second ferromagnetic layer 12B through silicon channel layer 7, a spin polarized current will flow between first ferromagnetic layer 12A and second ferromagnetic layer 12B. The change of the resistance between first ferromagnetic layer 12A and second ferromagnetic layer 12B can be measured by voltage.

Another of the possible evaluations is the measurement of the magneto-resistance in which only the interface resistance between first ferromagnetic layer 12A and silicon channel layer 7 and between second ferromagnetic layer 12B and silicon channel layer 7 is measured. Current is input between first ferromagnetic layer 12A and second ferromagnetic layer 12B through silicon channel layer 7, and voltage is output between second ferromagnetic layer 12B and first reference electrode 20. Thereby, the interface resistance between second ferromagnetic layer 12B and silicon channel layer 7 can be measured. Similarly, current is input between first ferromagnetic layer 12A and second ferromagnetic layer 12B through silicon channel layer 7, and voltage is output between first: ferromagnetic layer 12A and second reference electrode 21. Thereby, the interface resistance between first ferromagnetic layer 12A and silicon channel layer 7 can be measured.

Fifth Embodiment

Figure 6:
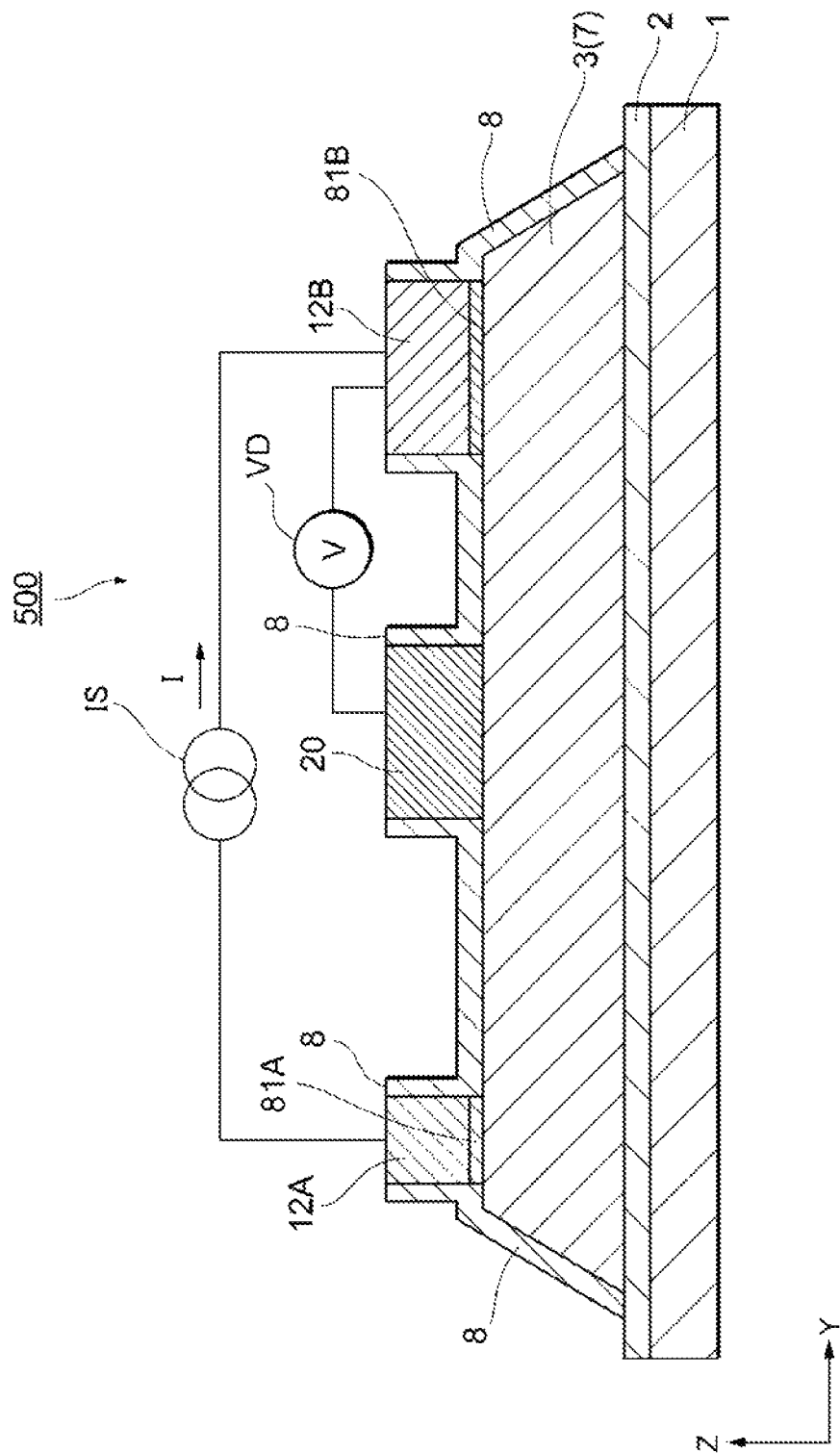
FIG. 6 is a cross-sectional view showing the magnetoresistive element according to the fifth embodiment.

As to magnetoresistive element 500 of the fat embodiment of the present invention, portions different from magnetoresistive element 200 of the second embodiment will be described. To the portion with the same structure as magnetoresistive element 200 of the second embodiment, same reference is used and description is omitted properly. FIG. 6 is a cross-sectional view showing the magnetoresistive element 500 according to the fifth embodiment. Magnetoresistive element 500 is different from magnetoresistive element 200 of the second embodiment in the configuration of first reference electrode 20. In magnetoresistive element 500, first ferromagnetic layer 12A, first reference electrode 20 and second ferromagnetic layer 12B are disposed in order on silicon channel layer 7. Except those mentioned above, it is the same as the second embodiment. In magnetoresistive element 500, current is input from second ferromagnetic layer 12B to first ferromagnetic layer 12A through silicon channel layer 7, and voltage is output between second ferromagnetic layer 12B and first reference electrode 20. As the difference of the fifth embodiment with magnetoresistive element 200 of second embodiment is that not only the interface resistance between second ferromagnetic layer 12B and silicon channel layer 7 but also the resistance of silicon channel layer 7 between second ferromagnetic layer 12B and first reference electrode 20 can be measured by the output voltage, because of the difference of the configuration of first reference electrode 12A.

Sixth Embodiment

Figure 7:
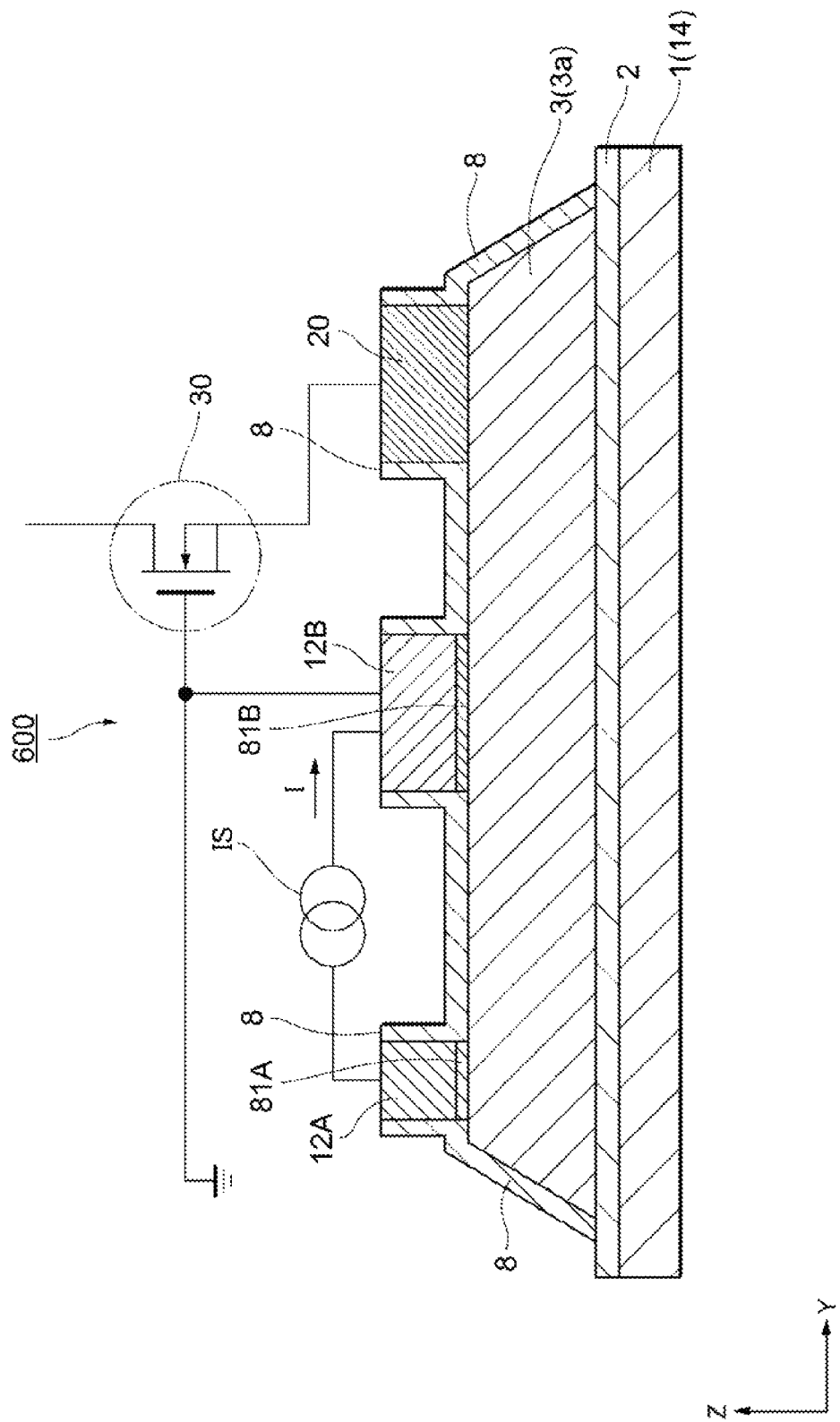
FIG. 7 is a cross-sectional schematic view showing the magnetoresistive element according to the sixth embodiment.

As to magnetoresistive element 600 of the sixth embodiment of the present invention, portions different from magnetoresistive element 300 of the second embodiment will be described. To the portion with the same structure as magnetoresistive element. 200 of the second embodiment, same reference is used and description is omitted properly. FIG. 7 is a cross-sectional schematic view Showing the magnetoresistive element 600 according to the sixth embodiment. Magnetoresistive element 600 is different from magnetoresistive element 200 of the second embodiment in that it further has MOSFET 30 for output amplification, in magnetoresistive element 600, second ferromagnetic layer 12B and the gate electrode of MOSFET 30 are electrically connected, and first reference electrode 20 and the source electrode of MOSFET 30 are electrically connected, so that the voltage between second ferromagnetic layer 12B and first reference electrode 20 is amplified by MOSFET 30. Magnetoresistive element 600 can be used as an element with a large output by using the amplification function of MOSFET 30.

Seventh Embodiment

In the seventh embodiment, an example is shown concerning the embodiment of the element suitable for a magnetic sensor. As to magnetic sensor 700 of the seventh embodiment of the present invention, portions different from magnetoresistive element 200 of the second embodiment will be described. To the portion with the same structure as magnetoresistive element 200 of the second embodiment, same reference is used and description is omitted property. Magnetic sensor 700 is different from magnetoresistive element 200 of the second embodiment in that magnetic sensor 700 has a magnetic shield and that first ferromagnetic layer 12A is located at the side where the magnetic flux of the external magnetic field enters magnetic sensor 700. When the magnetic sensor is used as a magnetic head, the ferromagnetic layer locates on the end face nearest to the magnetic media.

Figure 8:
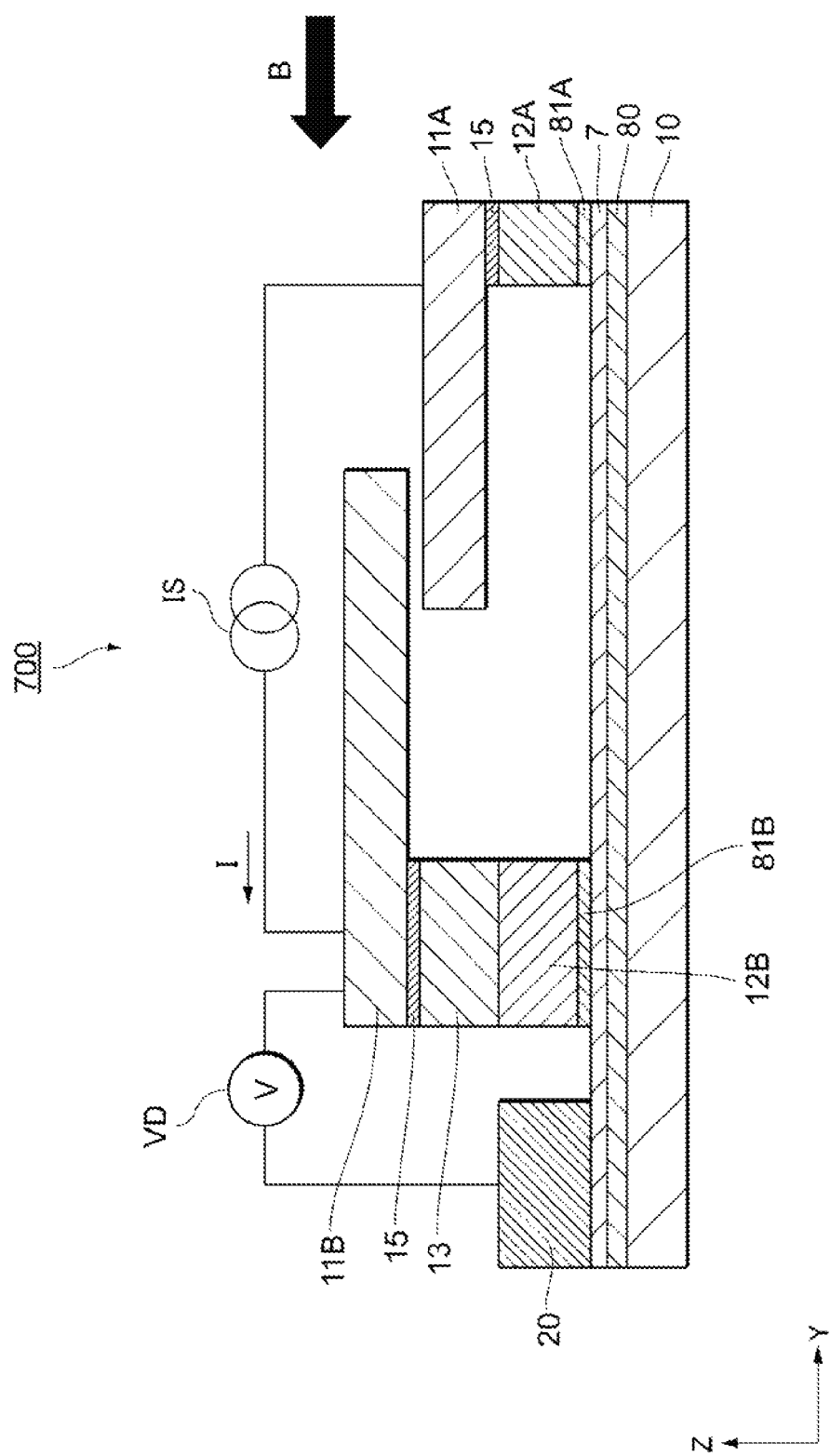
FIG. 8 is a cross-sectional view showing the magnetoresistive element according to the seventh embodiment.

FIG. 8 is a cross-sectional view showing the magnetic sensor 700 according to the seventh embodiment.

In magnetic sensor 700, when silicon is used as the semiconductor channel layer, foundation insulating layer 80 and silicon charnel layer 7 are provided on lower magnetic shield 10, wherein, silicon channel layer 7 is used as a semiconductor channel layer. Lower magnetic shield 10, foundation insulating layer 80 and silicon channel layer 7 are laminated in the order as above. Foundation insulating layer 80 is preferred to be made of a chemically stable material such as silicon oxide or silicon nitride. On silicon channel layer 7, first ferromagnetic layer 12A is disposed on the end in the direction in which the magnetic flux of the external magnetic field B enters. First tunnel layer 81A is inserted between silicon channel layer 7 and first ferromagnetic layer 12A, and functioned as a spin filter. First upper magnetic shield 11A is disposed on first ferromagnetic layer 12A. Cap layer 15 is disposed between first ferromagnetic layer 12A and first upper magnetic shield 11A. Cap layer 15 cuts the magnetic correlation between first ferromagnetic layer 12A and first upper magnetic shield 11A apart, and further it maintains the function of suppressing the diffusion of the elements between first ferromagnetic layer 12A and first upper magnetic shield 11A. The material for cap layer 15 is preferred to be Ta or Ru or the like. Similarly, second ferromagnetic layer 12B is disposed in a position apart from first ferromagnetic layer 12A on silicon channel layer 7. Second tunnel layer 81B is inserted between silicon channel layer 7 and second ferromagnetic layer 12B, and functions as a spin filter. Antiferromagnetic layer 13, cap layer 15 and second upper magnetic shield 11B are disposed on second ferromagnetic layer 12B. The materials for lower magnetic shield 10, first upper magnetic shield 11A and second upper magnetic shield 11B are preferred to be, for example, soft magnetic materials such as permalloy or the like. Lower magnetic shield 10, first upper magnetic shield 11A and second upper magnetic shield 11B have an effect of preventing the penetration of the magnetic flux containing a component in Z direction to magnetic sensor 700. Specially, second upper magnetic shield 11B has an effect of preventing the magnetization orientation of second ferromagnetic layer 12B from being influenced by external magnetic field. Antiferrnomagnetic layer 13 functions as a coupling film for maintaining the magnetization orientation of second ferromagnetic layer 12B. In a position opposite to first ferromagnetic layer 12A, first reference electrode 20 is disposed on silicon channel layer 7 with second ferromagnetic layer 12B sandwiched.

The coercivity of first ferromagnetic layer 12A is smaller than the coercivity of second ferromagnetic layer 12B. As external magnetic field B can be observed from the change of the magnetization orientation of first ferromagnetic layer 12A, it is preferred that the magnetization orientation of first ferromagnetic layer 12A is easily changed by external magnetic field B. On the contrary, second ferromagnetic layer 12B is preferred to be affected by external magnetic field B as little as possible. The change of the magnetization orientation of first ferromagnetic layer 12A can be measured as the resistance change between the interface of second ferromagnetic layer 12B and silicon channel layer 7 caused by the change of the relative angle of the magnetization orientations of first ferromagnetic layer 12A and second ferromagnetic layer 12B, wherein the magnetization information is transmitted by the spin polarized current.

Current source IS is disposed between first ferromagnetic layer 12A and second ferromagnetic layer 12B, and current is input from second ferromagnetic layer to first ferromagnetic layer 12A through silicon channel layer 7. Voltage meter VD is disposed between second ferromagnetic layer 12B and first reference electrode 20, and magnetic sensor 700 outputs the voltage between second ferromagnetic layer 12B and first reference electrode 20A.

Magnetic sensor 700 can be used in the reading element part of the magnetic head for reading the information from the magnetic recording medium. In this case, first ferromagnetic layer 12A is preferred to be disposed on the end part nearest to the magnetic recording medium of silicon channel layer 7.

Eighth Embodiment

Figure 9:
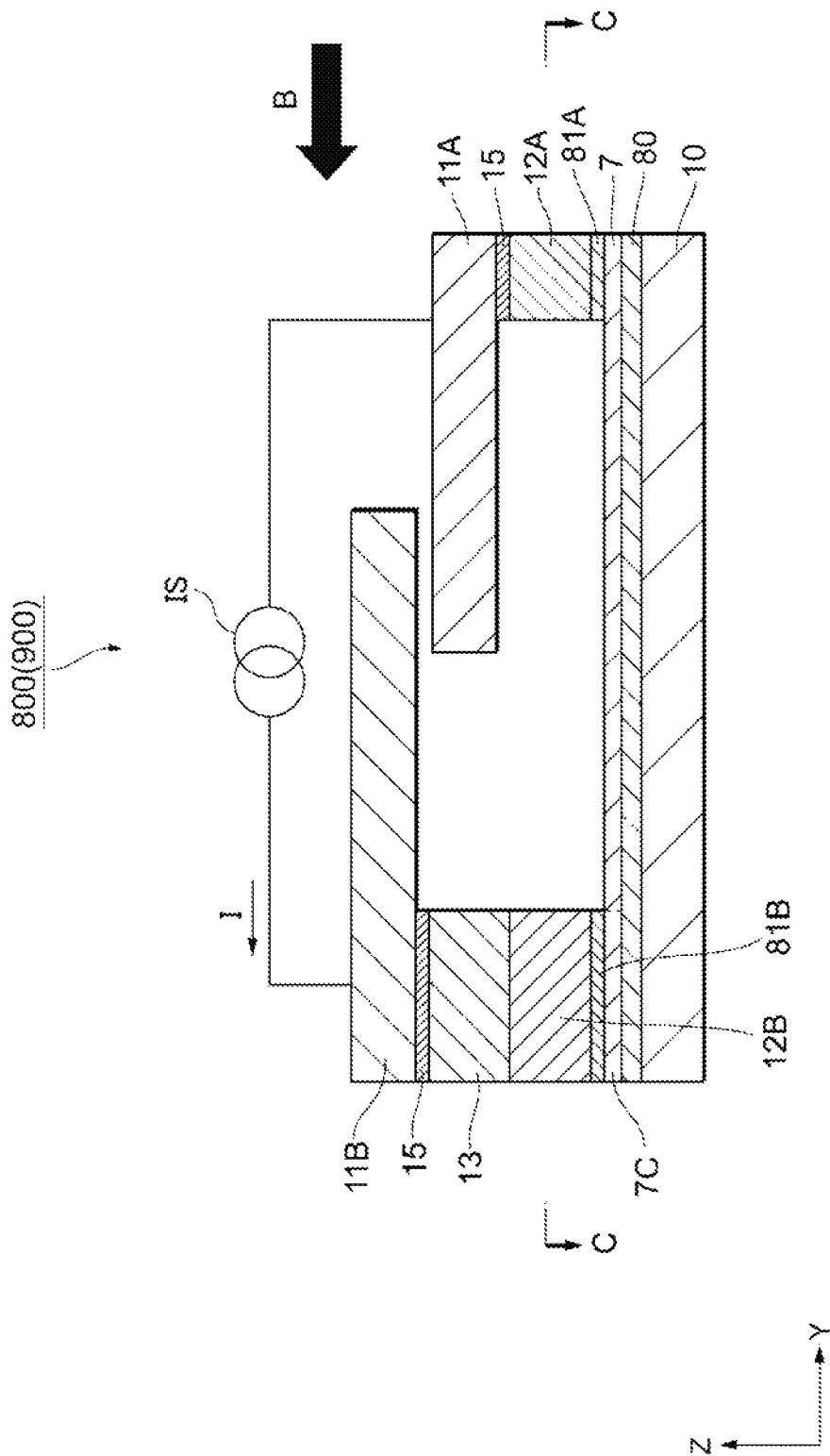
FIG. 9 is a cross-sectional view showing the magnetoresistive element according to the eighth embodiment.
Figure 10:
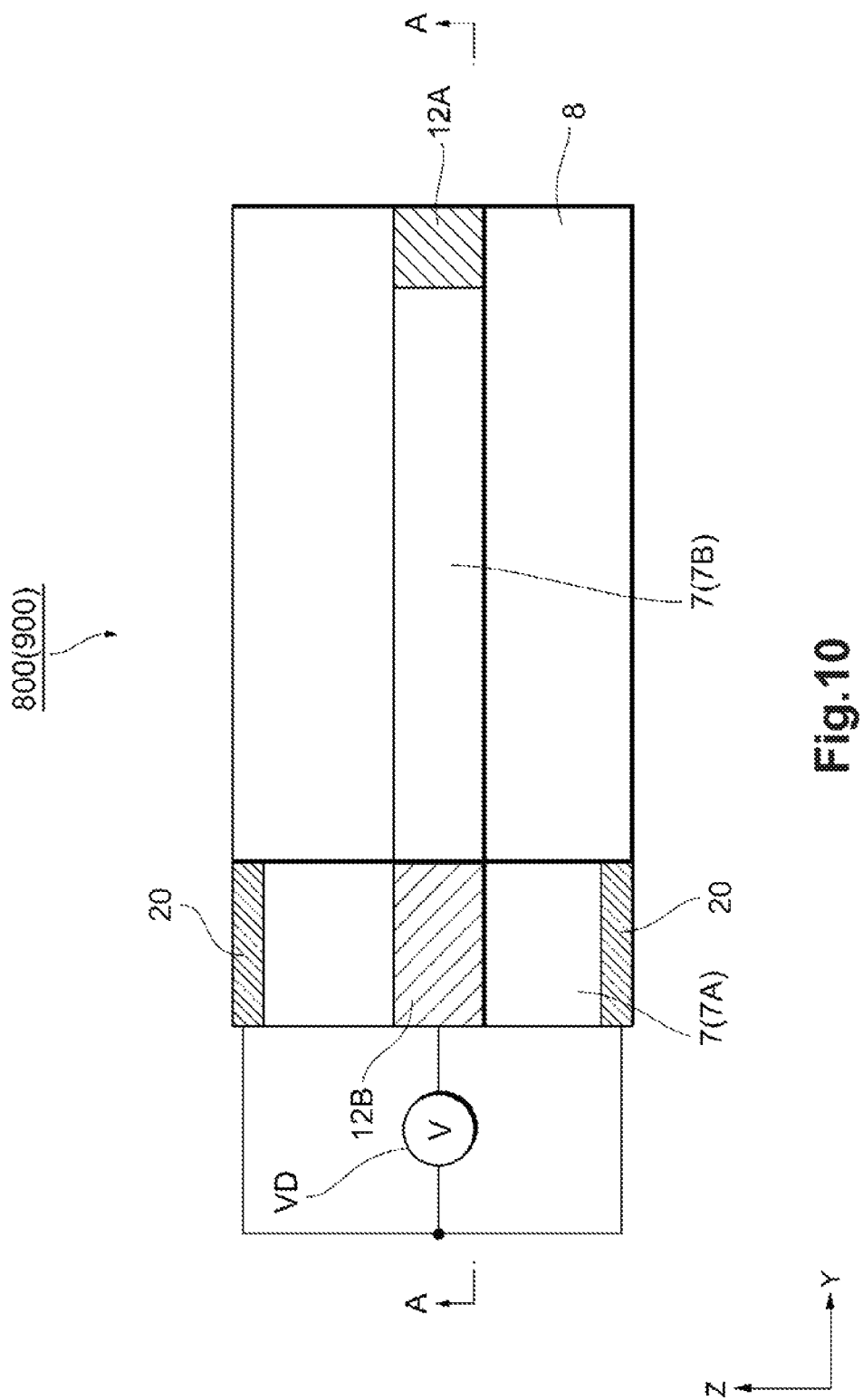
FIG. 10 is a cross-sectional schematic view showing the relationship between the structure of the silicon channel layer and the first ferromagnetic layer, the second ferromagnetic layer and the first reference electrode according to the eighth embodiment.

As to magnetoresistive element 800 and magnetic sensor 900 using magnetoresistive element 800 according to the eighth embodiment of the present invention, portions different from magnetoresistive element 200 of the second embodiment and magnetic sensor 700 of the seventh embodiment will be described. To the portion with the same structure as magnetoresistive element 200 of the second embodiment, same reference is used and description is omitted properly. FIG. 9 is a cross sectional view along the A-A line of FIG. 10, which shows magnetoresistive element 800 and magnetic sensor 900 of the eighth embodiment. FIG. 10 is a cross-sectional schematic view viewed from the direction of Z along the C-C line of FIG. 9, which shows the structure of silicon channel layer 7 of magnetoresistive element 800 and magnetic sensor 900 and the relationship among first ferromagnetic layer 12A, second ferromagnetic layer 12B and first reference electrodes 20. In magnetoresistive element 800 and magnetic sensor 900, silicon channel layer 7 is not in a line but formed by longitudinal structure 7A and latitudinal structure 7B, and it is formed as a T-shaped structure by the connection of longitudinal structure 7A and latitudinal structure 7B. Second ferromagnetic layer 12B is disposed on connection portion 7C of longitudinal structure 7A and latitudinal structure 7B, and first ferromagnetic layer 12A is disposed on latitudinal structure 7B away from the second ferromagnetic layer. Further, first reference electrodes 20 are disposed on longitudinal structure 7A away from second ferromagnetic layer 12B. Particularly, first reference electrodes 20 are disposed on the two ends of longitudinal structure 7A. Voltage meter VD disposed between second ferromagnetic layer 12B and first reference electrode 20 is connected with both of first reference electrodes 20 disposed on the two ends of longitudinal structure 7A. Voltage meter VD may be connected with either of first reference electrodes 20. By thrilling silicon channel layer 7 to a T-shape, the backfire of the spin current can be suppressed and a high output can be obtained.

EXAMPLES

Hereinafter, the present invention will be further described in detail based on Embodiments 1 to 8. However, the present invention is not limited to the following Examples 1 to 17.

Example 1

An SOI substrate composed of silicon substrate 1, silicon dioxide layer 2 (with a thickness of 200 nm) and silicon channel layer 7 (with a thickness of 100 nm) was prepared. Then an alignment mark was prepared on the SOI substrate by a photolithography method.

First of all, ion was injected into silicon channel layer 7. The ion injection was performed to determine the concentration of the impurities in the surface of silicon channel layer 7. Specifically, impurity ions for providing, an n-type electric conductivity was injected into the surface of silicon channel layer 7. As the impurities, phosphorus was used and energy of 5 keV was used. Then, impurities were diffused by annealing to adjust the electron concentration in the silicon film of silicon channel layer 7. The temperature of annealing was 900° C. and the holding time was set to 1 minute or less. The largest concentration of the impurities in the surface of silicon channel layer 7 was set to $2\times10^{20}$ cm$^{-3}$. The surface of silicon channel layer 7 referred to the area from the most superficial part to the per with a depth of several tens of nanometers of silicon channel layer 7. In the above method, the largest concentration of the impurities in the surface of silicon channel layer 7 was $2\times10^{20}$ cm$^{-3}$, while the part with the largest concentration of the impurities was the part with a depth of about 5 nm from the most superficial part. In addition, the most superficial part of silicon channel layer 7 referred to the face of about 1 atom level on which silicon channel layer 7 contacted with outside.

After that, attachment, organics and oxide film on the surface of silicon channel layer 7 was removed by cleaning. As the cleaning solution, isopropyl alcohol, acetone, pure water and hydrofluoric acid was used.

Then, etching was performed on silicon channel layer 7 so that the concentration of the impurities in the most superficial part of silicon channel layer 7 became the maximal. The etching was performed by ion milling. In order to decrease the damage to silicon channel layer 7, the incidence angle of the ion beam was adjusted to perform the ion milling. The ion beam was entered in a direction almost parallel to the silicon channel layer, and the silicon was slowly etched by the component caused by a divergent angle of the ion beam. The most superficial part of silicon channel layer 7 was etched by 5 nm by the method. After that, the treated substrate was placed in the atmosphere for 24 hours or more, and the surface of the silicon was naturally oxidized.

The etching method of silicon channel layer 7 to make the concentration of the impurities in the most superficial part of silicon channel layer 7 to be the maximal was not limited to the method mentioned above. For example, there was also a method of etching silicon channel layer 7 by oxidizing and then removing the oxide film by a chemical liquid. Optionally, there is also a method using chemical mechanical polishing (CMP).

After the natural oxide film on the surface of the silicon was removed using hydrofluoric acid, an iron film (with a thickness of 10 nm), a titanium film and a tantalum film were formed in the order by MBE method. Additionally, titanium film and tantalum film were cap layers for suppressing the characteristic deterioration caused by the oxidization of the iron film. As the titanium film and tantalum film are amorphous, the influence to the crystalline of the iron film was less.

As shown in FIG. 1A and FIG. 2, patterning was performed to remain a resist in a rectangular shape with the Y direction being the long axis containing the parts of first ferromagnetic layer 12A, second ferromagnetic layer 12B and first reference electrode 20. The size of the resist was 23 μm×80 μm. After the natural oxide film of silicon was milled by ion milling until silicon channel layer 7 was exposed, the part of the silicon other than the silicon channel layer under the resist was removed by an anisotropic etching. However, an alignment mark was pretreated so that the alignment mark was remained. The side surface of silicon channel layer 7 was etched to expose the (111) plane by an anisotropic etching, and the inclining angle of the side surface of silicon channel layer 7 was about 55 degree relative to the direction of Z axis as shown in FIG. 1. Further, the side surface of the obtained silicon channel layer 7 was oxidized and insulating layer 8 was formed by the silicon oxide film.

Patterning of resist was performed on the part of first ferromagnetic layer 12A, second ferromagnetic layer 12B and first reference electrode 20. After that, silicon channel layer 7, the iron film, the titanium film and the tantalum film were milled by ion milling. Additionally, silicon channel layer 7 was milled by 45 nm from the interface of silicon channel layer 7 and the iron film. In order to provide a difference in the magnetic anisotropic, the size of first ferromagnetic layer 12A was set to 21 μm×0.3 μm, the size of second ferromagnetic layer 12B was set to 21 μm×2 μm and the size of first reference electrode 20 was set to 21μm×21 μm. In addition, the distance between the electrodes of first ferromagnetic layer 12A and second ferromagnetic layer 12B and the distance between the electrodes of second ferromagnetic layer 12B and first reference electrode 20 were 20 μm respectively. In first ferromagnetic layer 12A, second ferromagnetic layer 12B and the side wall of the exposed silicon channel layer, silicon oxide was formed as insulating layer 8. After the mentioned resist was removed, patterning was performed so that the resist did not remain only on the part of first reference electrode 20. After that, silicon channel layer 7, the iron film, the titanium film and the tantalum film were milled by ion milling. Additionally, silicon channel layer 7 was milled by 3 nm to remove all the iron film on the surface. Then, an aluminium film of 50 nm and a tantalum film of 50 nm were formed as first reference electrode 20, the resist was removed, and silicon oxide was formed on the side wall of first reference electrode 20 as insulating layer 8. FIG. 1A and FIG. 2 showed the state mentioned above.

Then, wiring was performed to the meters using wires of metal on the top of first ferromagnetic layer 12A, second ferromagnetic layer 12B and first reference electrode 20 of the prepared element.

Figure 11:
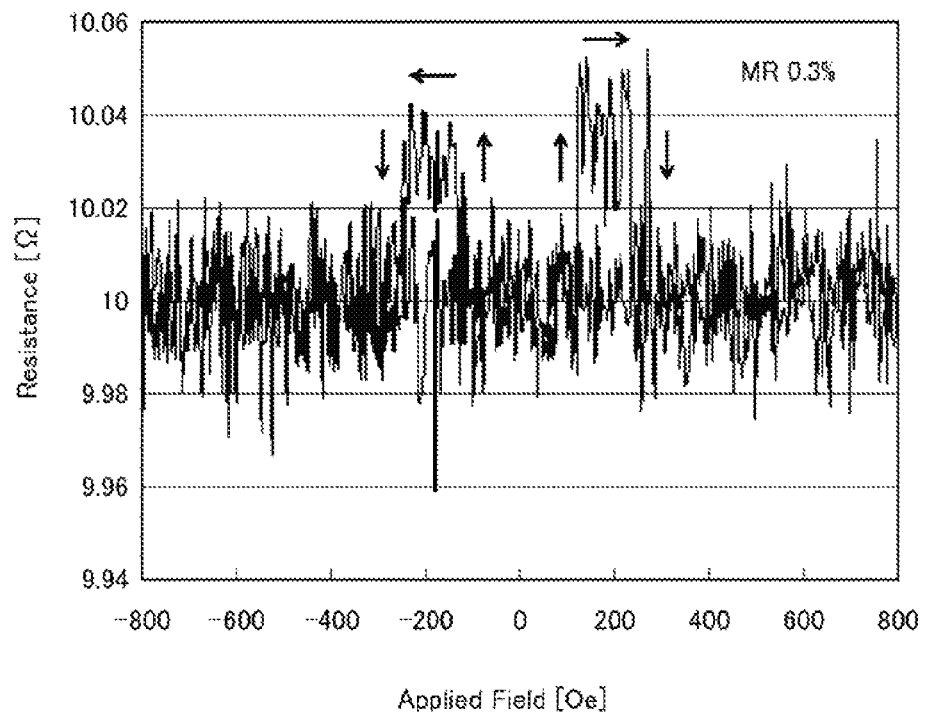
FIG. 11 is a view showing the measured result of the magnetoresistive element of Example 1.

The measured results of the magnetoresistive element of Example 1 were shown in FIG. 11. In Example 1, current source IS was disposed between first ferromagnetic layer 12A and second ferromagnetic layer 12B, and current flowed to first ferromagnetic, layer 12 from second ferromagnetic layer 12B through silicon channel layer 7. In addition, a voltage meter VD was disposed between second ferromagnetic layer 12B and first reference electrode 20, and the change of the voltage between second ferromagnetic layer 12B and first reference electrode 20 was measured. The measurement was performed while scanning the magnetic field in the direction of the easily magnetizable axis of first ferromagnetic layer 12A and second ferromagnetic layer 12B. Additionally, in the element of Example 1, the long axis of first ferromagnetic layer 12A and second ferromagnetic layer 12B was in the direction of Z axis, and the magnetic field in this direction was scanned. The current was a constant current of 3 mA and the change of the voltage was measured. FIG. 11 was a graph with the resistance value calculated from the measured voltage shown in the longitudinal axis and the magnetic field shown in the latitudinal axis. FIGS. 12 to 15 followed were the same. First of all, a magnetic field of −800 Oe was applied to the magnetoresistive element of Example 1 in the direction of Z axis. Then, in the process that the applied magnetic field was slowly changed to 800 Oe in the direction of Z axis, a sharp rise of the magneto-resistance in the magnetic field of 100 Oe was observed and a sharp decrease of the magneto-resistance in the magnetic field of 250 Oe was observed. Farther, the resistance values in the magnetic region of −800 to 100 Oe were equivalent to the resistance values in the magnetic region of 250 to 800 Oe. in a similar way, a magnetic field of 800 Oe in the direction of Z axis was applied to the magnetoresistive element of Example 1. In the process that the applied magnetic field was slowly changed to −800 Oe in the direction of Z axis, a sharp rise of the magneto-resistance in the magnetic field of −100 Oe was observed and a sharp decrease of the magneto-resistance in the magnetic field of −250 Oe was observed. Further, the resistance values in the magnetic region of 800 to −100 Oe were equivalent to the resistance values in the magnetic region of −250 to −800 Oe. In the experiments showing the magnetic field and resistance like this, the sample showing a wave with a square shape as shown in FIG. 11 was a typical example showing the magneto-resistance effect in which the resistance changes accompanying the change of the magnetization orientation of ferromagnetic. The magneto-resistance ratio was determined using the lowest resistance value and the highest resistance value which were calculated with the noise considered. In Example 1, a magneto-resistance ratio of 0.3% as obtained.

Example 2

The element structure of the magnetoresistive element of Example 2 was the structure as shown in the second embodiment of FIG. 3. The difference of the magnetoresistive element of Example 2 with the magnetoresistive element of Example 1 was that a tunnel layer was disposed between first ferromagnetic layer 12A and silicon channel layer 7 and between second ferromagnetic layer 12B and silicon channel layer 7.

The preparation method of the element was the same as Example 1 except that before iron film was laminated on silicon channel layer 7, a magnesium oxide film (with a thickness of 0.8 nm) was formed on silicon channel layer 7 by super high-vacuum electron beam evaporation method and first ferromagnetic layer 12A and second ferromagnetic layer 12B was formed. Further, patterning was performed to preserve only the resist of the part of first reference electrode 20. After that, the silicon channel layer, the magnesium oxide, the iron film, the titanium film and the tantalum film was milled by ion milling. Additionally, silicon channel layer 7 was milled by 3 nm to remove all the iron film on the surface. After that an aluminium film of 50 nm and a tantalum film of 50 nm were formed and the resist was removed.

Figure 12:
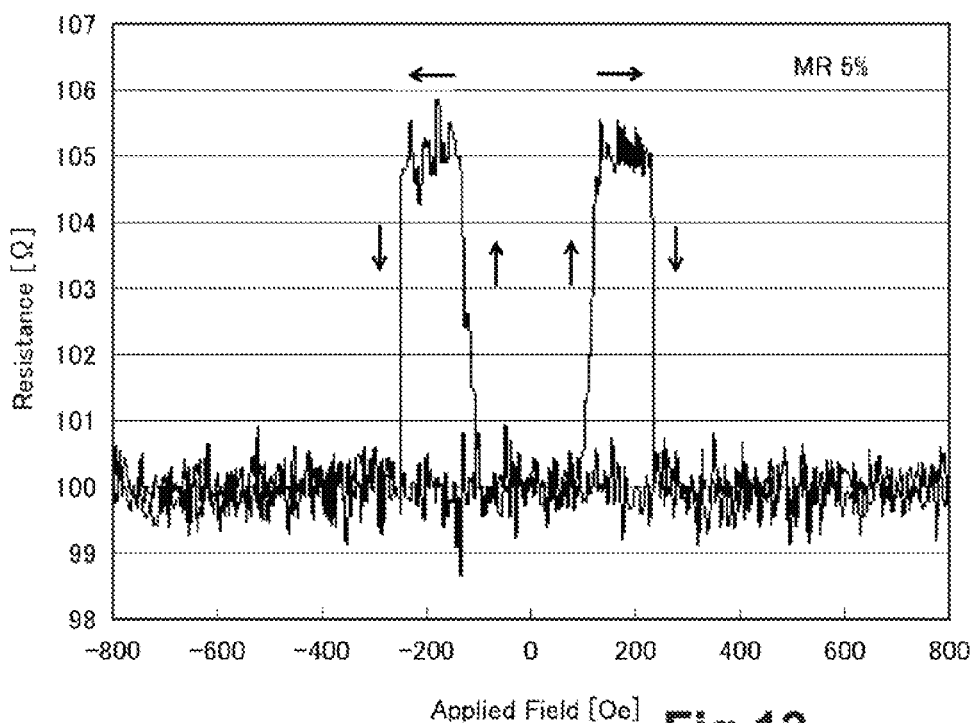
FIG. 12 is a view showing the measured result of the magnetoresistive element of Example 2.

The measured result of the magnetoresistive element of Example 2 was shown in FIG. 12. In Example 2, current source IS was disposed between first ferromagnetic layer 12A and second ferromagnetic layer 12B, and current flowed from second ferromagnetic layer 12B to first ferromagnetic layer 12A through silicon channel layer 7. In addition, a voltage meter VD was disposed between second ferromagnetic layer 12B and first reference electrode 20, and measured the change of the voltage between second ferromagnetic layer 12B and first reference electrode 20. The method of scanning the magnetic field was the same as Example 1. The current was a constant current of 3 mA, and the change of the voltage was measured. The magneto-resistance ratio was determined using the lowest resistance value and the highest resistance value which were calculated with the noise considered. In Example 2, a magneto-resistance ratio of 5% was obtained.

Comparison Between Example 1 and Example 2

In Example 1, as shown in FIG. 11, the magneto-resistant effect vas observed. Similarly, in Example 2, as shown in FIG. 2, the magneto-resistance effect was measured. The difference between Example 1 and Example 2 was whether a tunnel layer existed between the silicon channel layer and the ferromagnetic layer. In Example 2, a tunnel layer was disposed, thus, the resistance of the element was higher than that in Example 1. However, a higher result of magneto-resistance ratio was obtained in Example 2. That is, it was shown that the magneto-resistance ratio was particularly increased by inserting the tunnel layer. It was a well known phenomenon that a giant magneto-resistance ratio could be obtained by inserting a tunnel layer between the ferromagnetic layers in the magnetoresistive element where normal metals were laminated. However, it was unknown up to now that in a case when spin was transported in the non-magnetic semiconductor channel layer, a giant magneto-resistance ratio could be obtained.

Example 3

The magnetoresistive element of Example 3 was an element based on the third embodiment. In Example 3, the element was prepared by a similar method as Example 1. However, the laminated. structure of the parts of first ferromagnetic layer 12A and second ferromagnetic layer 12B was different from that of Example 1. Example 3 was prepared similarly as Example 1 until the part that an the silicon channel layer, an iron film (with a thickness of 10 nm), a titanium film and a tantalum film were formed by an MBE method in the order, and portions equivalent to first ferromagnetic layer 12A and second ferromagnetic layer 12B were formed by ion milling.

Then, a photoresist was formed on the part other than. that corresponding to second ferromagnetic layer 12B. After that, the iron layer of the part corresponding to second ferromagnetic layer 12B was exposed by ion milling. Etching was performed on the exposed iron layer using hydrochloric acid diluted with pure water to expose silicon channel layer 7. The surface of silicon channel layer 7 exposed was washed by hydrofluoric acid and then as magnesium oxide film (with a thickness of 0.8 nm) was formed on this part by a super high-vacuum electron beam evaporation method. After that, an iron film (with a thickness of 10 nm), a titanium film and a tantalum film were formed by an MBE method in the order. At last, second ferromagnetic layer 12B was formed by removing the photoresist. The preparation method after that was the same as Example 1.

Figure 13:
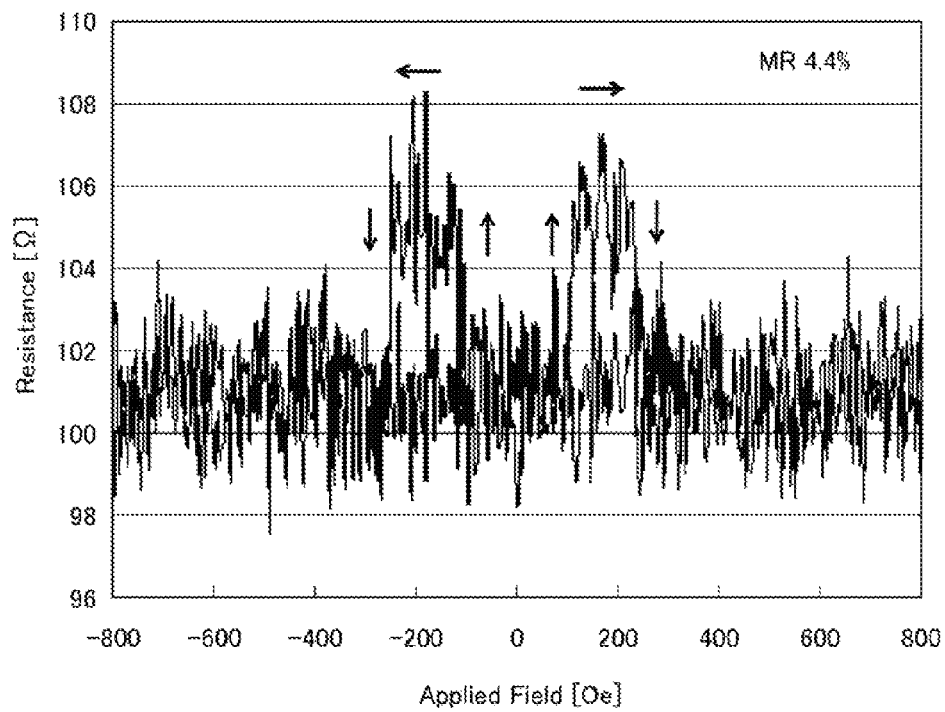
FIG. 13 is a view showing the measured result of the magnetoresistive element of Example 3.
Figure 14:
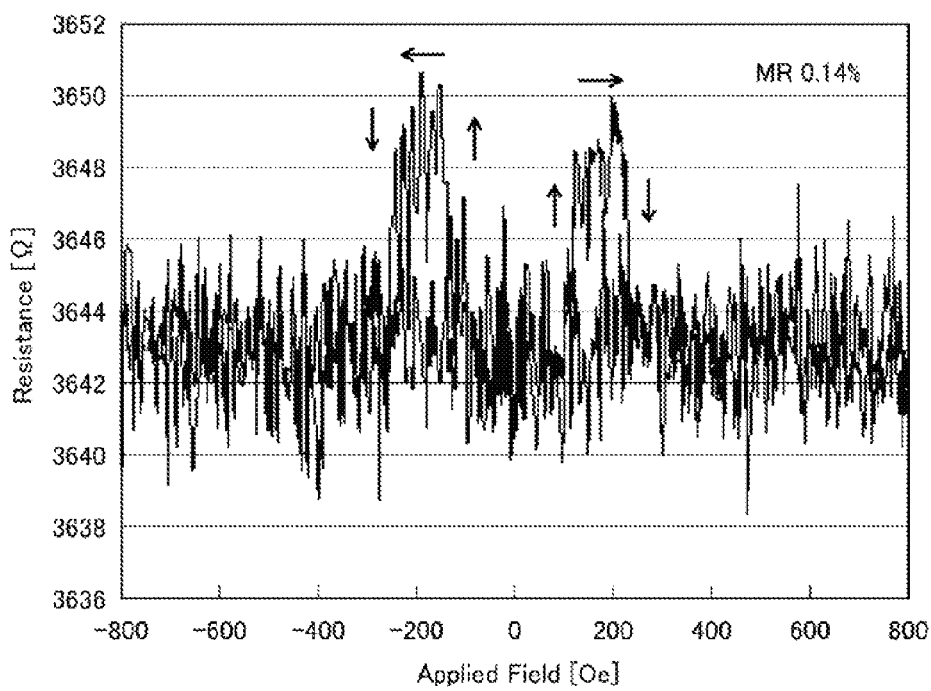
FIG. 14 is a view Showing the measured result of the magnetoresistive element of Comparative example 1.
Figure 15:
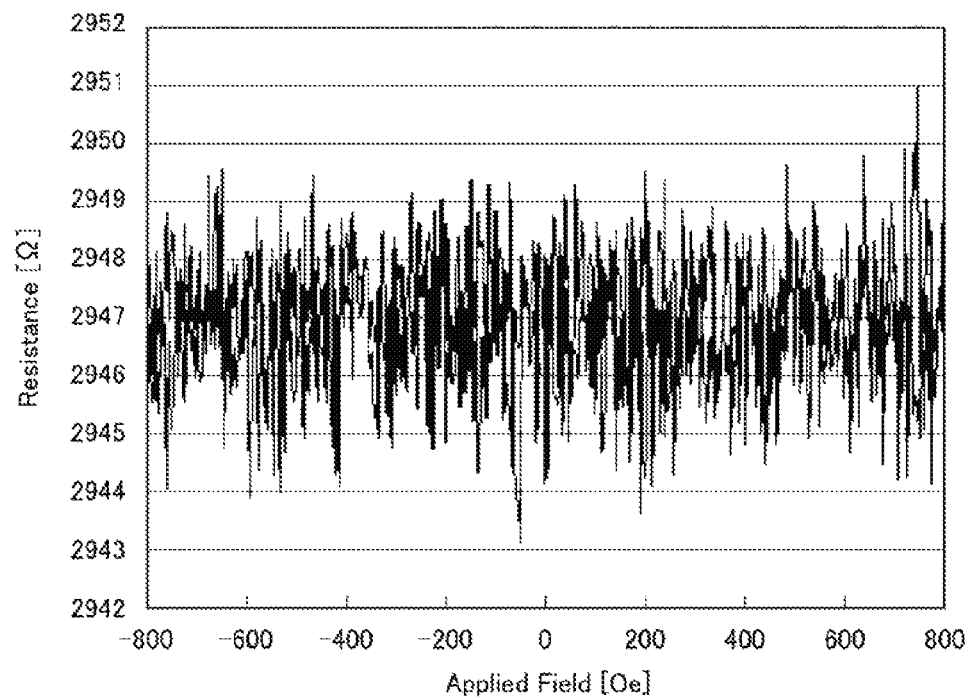
FIG. 15 is a view showing the measured result of the magnetoresistive element of Comparative example 2.

The measured result of the magnetoresistive element of Example 3 was shown in FIG. 13. In Example 3, current source IS was disposed between first ferromagnetic layer 12A and second ferromagnetic layer 12B, and current flowed from second ferromagnetic layer 12B to first ferromagnetic layer 12A through silicon channel layer 7. In addition, a voltage meter VD was disposed between second ferromagnetic layer 12B and first reference electrode 20, and measured the change of the voltage between second ferromagnetic layer 12B and first reference electrode 20. The method for scanning the magnetic field was the same as Example 1. The current was a constant current of 3 mA and the change of the voltage was measured. The magneto-resistance ratio was determined using the lowest resistance value and the highest resistance value, which were calculated with the noise considered. It Example 3, a magneto-resistance ratio of 0.31% was obtained.

Comparative Example 1

As Comparative example 1, a magnetoresistive element was prepared with a structure as shown in the fourth embodiment except the connection position of voltage meter VD. The element of Comparative example 1 was prepared similarly as the element of Example 2 except that second reference electrode 21 was also thrilled when first reference electrode 20 of Example 2 was formed. However, a current source IS and a voltage meter VD were disposed between first ferromagnetic layer 12A and second ferromagnetic layer 12B, and the change of the voltage between first ferromagnetic layer 12A and second ferromagnetic layer 12B was measured. The direction of the current and the other measuring methods were the same as Example 2. The measured results of the magnetoresistive element of Comparative example 1 were shown in FIG. 14. In Comparative example 1, a magneto-resistance ratio of 0.14% was obtained.

Comparative Example 2

As the magnetoresistive element of Comparative example 2, the magnetoresistive element in Comparative example 1 was used in measurement except the connection position of voltage meter VD. A current source IS was disposed between first ferromagnetic layer 12A and second ferromagnetic layer 12B, and a voltage meter VD was disposed between first ferromagnetic layer 12A and second reference electrode 21 to measure the change of the voltage between first ferromagnetic layer 12A and second reference electrode 21. The direction of the current and the other measuring methods were the same as Example 2. The measured results of the magnetoresistive element of Comparative example 2 were shown in FIG. 15. In Comparative example 2, the magneto-resistance ratio could not be measured.

Comparison Among Example 2, Comparative Example 1 and Comparative Example 2

When Example 2 was compared with Comparative example 1 and Comparative example 2, the difference in element structure was whether second reference electrode 21 was contained, while they were completely the same in that current was input between first ferromagnetic layer 12A and second ferromagnetic layer 12B and a spin polarized current flowed. In addition, in all the methods, a spin polarized current was flowing between first ferromagnetic layer 12A and second ferromagnetic layer 12B. However, the arrangements of the voltage meter in Example 2. Comparative example 1 and Comparative example 2 were different, and the positions for measuring the resistance were different. in Example 2, the interface resistance between silicon channel layer 7 and second ferromagnetic layer 12B was measured. In Comparative example 1, the total resistance between first ferromagnetic layer 12A and second ferromagnetic layer 12B was measured. And in Comparative example 2, the interface resistance between silicon channel layer 7 and first ferromagnetic layer 12A was measured.

The results calculated in Example 2, Comparative example 1 and Comparative example 2 were shown in Table 1.

TABLE 1

|  | Resistance of the element [Ω] | magneto-resistance [Ω] | magneto-resistance ratio [%] |
|---|---|---|---|
| the interface resistance between the silicon channel layer and the second ferromagnetic layer (Example 2) | 100 | 5 | 5 |
| the resistance between the first and the second ferromagnetic layer (Comparative example 1) | 3645 | 5 | 0.14 |
| the interface resistance between the silicon channel layer and the first ferromagnetic layer (Comparative example 2) | 596 | 0 | 0 |

The values of the magneto-resistance obtained in Example 2 and Comparative example 1 were the same. On the contrary, no magneto-resistance could be observed in Comparative example 2. From this, it was known that a magneto-resistance between ferromagnetic layers with silicon channel layer 7 sandwiched was provided in the interface of second ferromagnetic layer 12. That is, compared to Comparative example 1 which was a conventional measuring method of magneto-resistance, the magneto-resistance of Example 2 was the same while the element resistance of Example 2 was smaller, therefore the magneto-resistance ratio of Example 2 was larger. As a result, it was known that Example 2 had an effect of more than 10 times on magneto-resistance ratio compared to Comparative example 1. In addition, from Non-Patent Document 2, it was known that when the channel layer was metal material, similar magneto-resistance effect could be observed in both the interface between the channel layer and the first ferromagnetic layer and the interface between the channel layer and the second ferromagnetic layer. That is, it was known that the effects of Example 1 and Example 2 were a phenomenon limited to the case when the material of the channel layer was a semiconductor material.

Example 4

The magnetoresistive element of Example 4 was prepared similarly as Example 2 except that the distances d between the electrodes of first ferromagnetic layer 12A and second ferromagnetic layer 12B were changed in the range of 1~100 μm. The measurement of the magneto-resistance was performed under the same condition with the measurement of the magnetoresistive element of Example 2.

Figure 16:
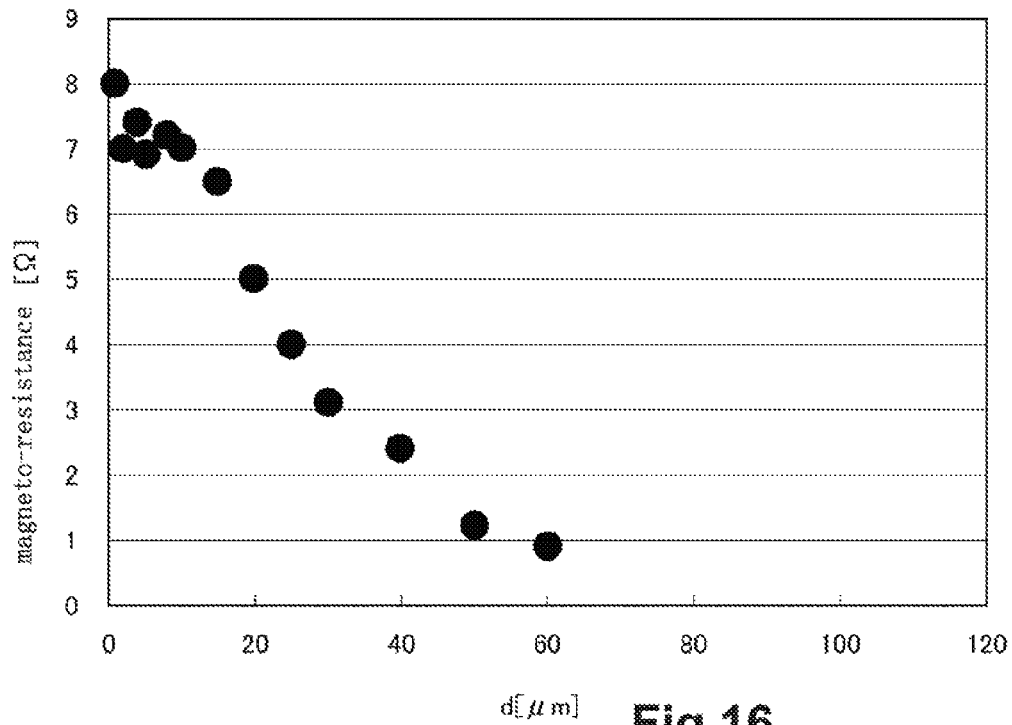
FIG. 16 is a view showing the relationship of the distance between the electrodes and the magneto-resistance of the magnetoresistive element of Example 4.

The relationship of the distance between the electrodes with the magneto-resistance was shown in FIG. 16. When the distance between the electrodes was 70 μm or more, no magneto-resistance could be observed. A tendency could be found from FIG. 16 that the larger the distance between the electrodes was, the smaller the value of the magneto-resistance was. It could be known that in the area where the distance between the electrodes was short, the largest magneto-resistance was 8Ω, and when the distance between the electrodes was about 25 nm, the magneto-resistance was 4Ω. Thus, it was known that the spin transport distance of silicon channel layer 7 was about 25 μm. In addition, it was known that the change of the magneto-resistance was large relative to a distance of about the spin transport distance between the electrodes, and it was preferred to use with a shorter distance between electrodes than the spin transport distance.

Example 5

FIG. 6 was a view showing the magnetoresistive clement according to the fifth embodiment. The magnetoresistive element of Example 5 was prepared by the same way as Example 2. Similar to Example 2, tunnel layers were disposed between first ferromagnetic layer 12A and silicon channel layer 7 and between second ferromagnetic layer 12B and silicon channel layer 7. In addition, in contrast to the positions of second ferromagnetic layer 12B and first reference electrode 20 in Example 2, first reference electrode 20 was disposed between first ferromagnetic layer 12A and second ferromagnetic layer 12B.

From the measured results of the magneto-resistance ratio, it was known that a magneto-resistance ratio of 0.3% was obtained. The magneto-resistance ratio was lower than Example 2, while the magneto-resistance ratio was measured similarly as Examples 1 and 2. One of the reasons was considered to be as follows. The resistance of silicon channel layer 7 between second ferromagnetic layer 12B and first reference electrode 20 became a part of the element resistance by disposing first reference electrode 20 between first ferromagnetic layer 12A and second ferromagnetic layer 12B. In addition, a part of the spin polarized current flowing in silicon channel layer 7 was absorbed by first reference electrode 20. This was also considered to be related to the decreasing of the magneto-resistance ratio.

Example 6

The magnetoresistive element of Example 6 was prepared by the same way as Example 2. However, Ge was used as the material of semiconductor channel layer 3. The substrate was a GOI (Germanium On Insulator) structure with Ge and $GeO_2$ laminated, and the construction of the thickness was the same as Example 1, that is, the thickness of $GeO_2$ was 200 nm and the thickness of Ge was 100 nm. Impurities were added to the germanium channel layer which was semiconductor channel layer 3 so that the largest electron concentration in the surface of the germanium channel layer became $2 \times 10^{19}$ $cm^{-3}$. Before the iron film was laminated on the germanium channel layer, a magnesium oxide film (with to thickness of 0.8 nm) was formed on the germanium channel layer by a super high-vacuum electron beam evaporation method. In addition, the distance between the electrodes of first ferromagnetic layer 12A and second ferromagnetic layer 12B was 1 μm.

The magneto-resistance ratio was measured similarly as Example 2, and a magneto-resistance ratio of 0.8% was obtained.

Example 7

The magnetoresistive element of Example 7 was prepared by the same way as Example 2, However, SiGe was used as the material of semiconductor channel layer 3. The substrate was an SGOI (SiGe On Insulater) structure with SiGe and $SiO_2$ laminated, and the construction of the thickness was the same as Example 2, that is, the thickness of $SiO_2$ was 200 nm and the thickness of Ge was 100 nm. Additionally, the ratio of silicon and germanium in SiGe was that silicon accounted for 80% and germanium accounted for 20% in terms of element ratio. Impurities were added to the silicon-germanium channel layer which was semiconductor channel layer 3 so that the largest electron concentration in the surface of the silicon-germanium channel layer became $2 \times 10^{20}$ $cm^{-3}$. Before the iron film was laminated on the silicon-germanium channel layer, a magnesium oxide film (with a thickness of 0.8 nm) was formed on the silicon-germanium channel layer by a super high-vacuum electron beam evaporation method. In addition, the distance between the electrodes of first ferromagnetic layer 12A and second ferromagnetic layer 12B was 1 μm.

The magneto-resistance ratio was measured similarly as Example 2, and a magneto-resistance ratio of 3.8% was obtained.

Example 8

The magnetoresistive element of Example 8 was prepared by the same way as Example 2. However, gallium arsenide (GaAs) was used as the material of semiconductor channel layer 3. The substrate was prepared by grain growing i-GaAs(250 nm)/n$^-$-GaAs(Si=$3 \times 10^{16}$ $cm^{-3}$ and 2500 nm)/n$^+$-GaAs(Si=$3 \times 10^{18}$ $cm^{-3}$ and 30 nm) by an MBE method on GaAs (001). Additionally, semiconductor channel layer 3 was n$^-$-GaAs (Si=$3 \times 10^{16}$ $cm^{-3}$ and 2500 nm). Before the iron film was laminated on the gallium arsenide channel layer, a magnesium oxide film (with a thickness of 0.8 nm) was formed on the gallium arsenide channel layer by a super high-vacuum electron beam evaporation method. In addition, the distance between the electrodes of first ferromagnetic layer 12A and second ferromagnetic layer 12B was 1 μm.

The magneto-resistance ratio was measured similarly as Example 2, and a magneto-resistance ratio of 2.9% was obtained.

Example 9

The magnetoresistive element of Example 9 was prepared by the same way as Example 2. However, indium arsenide (InAs) was used as the material of semiconductor channel layer 3. Before the iron film was laminated on the indium arsenide channel layer, a magnesium oxide film (with a thickness of 0.8 nm) was formed on the indium arsenide channel layer by a super high-vacuum electron beam evaporation method. In addition, the distance between the electrodes of first ferromagnetic layer 12A and second ferromagnetic layer 12B was 1 μm.

The magneto-resistance ratio was measured similarly as Example 2, and a magneto-resistance ratio of 0.5% was obtained.

Example 10

The magnetoresistive element of Example 10 was prepared by the same way as Example 2. However, silicon carbide (SiC) was used as the material of semiconductor channel layer 3. Before the iron film was laminated on the silicon carbide layer, a magnesium oxide film with a thickness of 0.8 nm) was formed on the silicon carbide layer by a super high-vacuum electron beam evaporation method. In addition, the distance between the electrodes of first ferromagnetic layer 12A and. second ferromagnetic layer 12B was 1 μm.

The magneto-resistance ratio was measured similarly as Example 2, and a magneto resistance ratio of 0.6% was obtained.

Example 11

The magnetoresistive element of Example 11 was prepared by the same way as Example 2. However, Graphene was used as the material of semiconductor channel layer 3. As to the substrate, a silicon substrate with a thermal oxide film was used. The Graphene was grain grown on a nickel substrate separately, and was pasted on the silicon substrate with a thermal oxide film to farm an element. Before the iron film was laminated on the Graphene layer, a magnesium oxide film (with a thickness of 0.8 nm) was formed on the Graphene layer by a super high-vacuum electron beam evaporation method. In addition, the distance between the electrodes of first ferromagnetic layer 12A and second ferromagnetic layer 12B was 1 μm.

The magneto-resistance ratio was measured similarly as Example 2, and a magneto-resistance ratio of 4.2% was obtained.

Example 12

The magnetoresistive element of Example 12 was prepared by the same way as Example 2. However, Graphite was used as the material of semiconductor channel layer 3. As to the substrate, a silicon substrate with a thermal oxide film was used, The Graphite was vapor deposited separately and then pasted on the silicon substrate with a thermal oxide film to form an element. Before the iron film was laminated on the Graphite layer, a magnesium oxide film (with a thickness of 0.8 nm) was formed on the Graphite layer by a super high-vacuum electron beam evaporation method. In addition, the distance between the electrodes of first ferromagnetic layer 12A and second ferromagnetic layer 12B was 1 μm.

The magneto-resistance ratio was measured similarly as Example 2, and a magneto-resistance ratio of 0.9% was obtained.

Example 13

The magnetoresistive element of Example 13 was prepared by the same way as Example 2. However, Silicene was used as the material of semiconductor channel layer 3. As to the substrate, a silicon substrate with a thermal oxide film was used. The Silicene was grain grown on a zirconium diboride substrate separately and then was pasted on the silicon substrate with a thermal oxide film to form an element. Before the iron film was laminated on the Silicene layer, a magnesium oxide film (with a thickness of 0.8 nm) was formed on the Silicene layer by a super high-vacuum electron beam evaporation method, in addition, the distance between the electrodes of first ferromagnetic layer 12A and second ferromagnetic layer 12B was 1 μm.

The magneto-resistance ratio was measured similarly as Example 2, and a magneto resistance ratio of 3.2% was obtained.

Example 14

The magnetoresistive element of Example 14 was prepared by the same way as Example 2. However, PEDOT:PSS was used as the material of semiconductor channel layer 3. As to the substrate, a silicon substrate with a thermal oxide film was used. PEDOT:PSS was formed by coating using a spin-coating method on the silicon substrate with a thermal oxide film. Before be iron film was laminated on the PEDOT:PSS layer, a magnesium oxide film (with a thickness of 0.8 nm) was formed on the PEDOT:PSS layer by a super high-vacuum electron beam evaporation method. In addition, the distance between the electrodes of first ferromagnetic layer 12A and second ferromagnetic layer 12B was 1 μm.

The magneto-resistance ratio was measured similarly as Example 2, and a magneto-resistance ratio of 0.3% was obtained.

Example 15

The magnetoresistive element of Example 2 was used. A gate voltage was applied on the element, and the relationship of the gate voltage and the magneto-resistance ratio was evaluated. As shown in FIG. 1B, a voltage source VS was connected between silicon substrate 1 and second ferromagnetic layer 12B, and a voltage from back gate was applied on the magnetoresistive element of Example 2. In the magnetoresistive element of Example 2, current was flowing from second ferromagnetic layer 12B to first ferromagnetic layer 12A through silicon channel layer 7. Thus, first ferromagnetic layer 12A was the source electrode and second ferromagnetic layer 12B was the drain electrode. The applied current was 3 mA and the magnetic field of ±800 Oe was used. The gate voltage was set as −125∼+175V Other measuring conditions were set as the same as Example 2, and the magneto-resistance ratio was measured.

Figure 17:
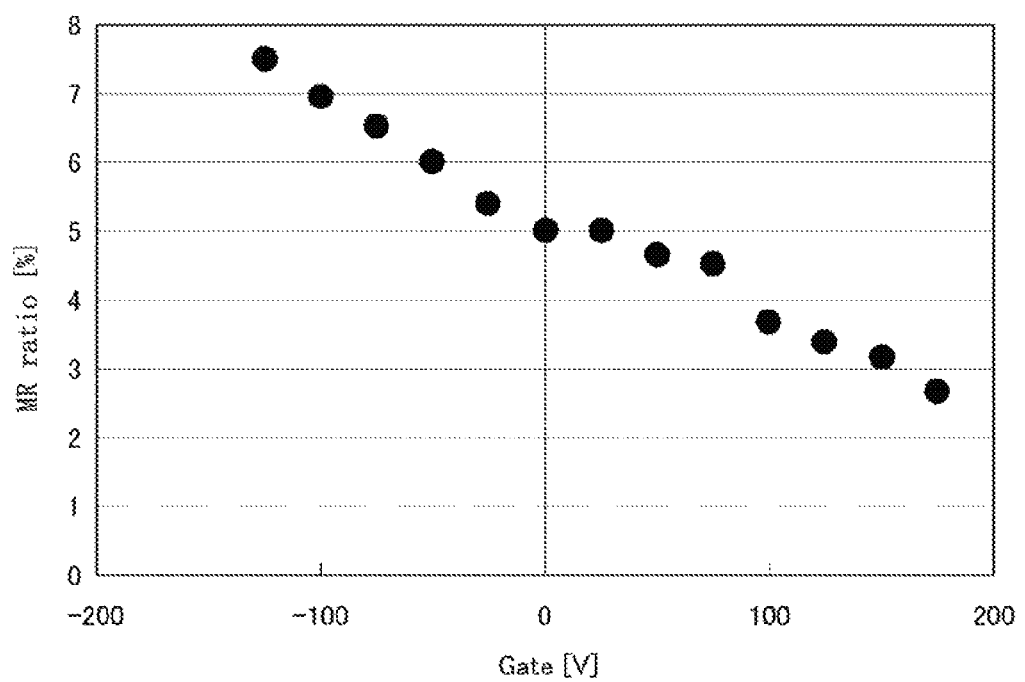
FIG. 17 is a view showing the relationship of the gate voltage and the magneto-resistance ratio in the magnetoresistive element of Example 15.

FIG. 17 is a view showing the relationship of the gate voltage and the magneto-resistance ratio in the magnetoresistive element of Example 2. It was known that the magneto-resistance ratio was changed corresponding to the change of the gate voltage. In addition, a tendency could be observed that the magneto-resistance ratio would be increased when the resistivity of semiconductor channel layer 3 was increased due to the gate voltage. If considered simply, the resistance related to spin showed a relation in proportion to the resistivity of semiconductor channel layer 3, and if the resistivity of semiconductor channel layer 3 was increased, the resistance related to spin would. also increase. At the same time, even the resistance of semiconductor channel layer 3 was increased, however the background of the voltage measured in the measuring method of the output voltage of Example 2 would hardly be influenced by the resistance of semiconductor channel layer 3, thus, it could be considered that the increasing of the resistance related to spin is related to the increasing of the magneto-resistance ratio.

According to Patent documents 1 and 2, in the Spin-MOSFET, the source electrode and the drain electrode of the transistor were composed of ferromagnetic Spin-MOSFET was formed by the change of the resistance caused by the magneto-resistance effect between the source electrode and the drain electrode. Example 15 was similar with Patent documents 1 and 2 except that first reference electrode 20 composed of non-magnetic material was newly disposed, and only the resistance change of the interface between the drain electrode and semiconductor channel layer 3 was extracted, if Example 15 was compared with Patent documents 1 and 2, there was one interface resistance in Example 15 while two interface resistances and the resistance of the semiconductor channel layer became the resistance of background in Patent documents 1 and 2. Simply, in Example 15, at least an improvement of 2 times or more in the ratio of the signal and the background (SIN) could be expected when compared to Patent documents 1 and 2. Comparative example 1 was the same as Patent documents 1 and 2 in the measuring method. From the measuring result of the magneto-resistance ratio, it could be known that the SIN was improved by about 36 times in Example 2 which had the same magnetoresistive elements as Example 15, when compared to Comparative example 1. In addition, it could be confirmed that in Example 15 a magneto-resistance was further provided, and the magneto-resistance ratio could be modulated by the gate voltage in addition to the general MOSFET action which was the same as in Patent documents 1 and 2. Thus, although Example 15 had some difference in the structure compared with Patent documents 1 and 2, it could action by the same physical phenomenon, and was a Spin-MOSFET which could action with a higher S/N than Patent documents 1 and 2.

Example 16

FIG. 7 was a view of element showing the magnetoresistive element of Example 16, The magnetoresistive element was based on the magnetoresistive element of the sixth embodiment, and an MOSFET and an electric wiring were added separately to the magnetoresistive element of Example 2. In the magnetoresistive element of Example 16, second ferromagnetic layer 12B and the gate electrode of MOSFET 30 was electrically connected, first reference electrode 20 and the source electrode et MOSFET 30 was electrically connected, and the voltage between second ferromagnetic layer 12B and first reference electrode 20 was amplified by MOSFET 30.

A current of 3 mA was applied between first ferromagnetic layer 12A and second. ferromagnetic layer 12B through silicon channel layer 7. The output between silicon channel layer 7 and second ferromagnetic layer 12B was applied to MOSFET 30 and the current flowing in MOSFET 30 was changed. When the magnetization orientation of first ferromagnetic layer 12A was parallel to that of second ferromagnetic layer 12B, the gate voltage applied to MOSFET 30 was 0.3V and when the magnetization orientation of first ferromagnetic layer 12A was anti-parallel to that of second ferromagnetic layer 12B, the gate voltage applied to MOSFET 30 was 0.315V. An output amplification of 10 times could be confirmed in the output of MOSFET 30 according to the change of the relative angle of the magnetization orientations of first ferromagnetic layer 12A and second ferromagnetic layer 12B.

Example 17

Example 17 was an example of the magnetic sensor and the magnetic head based on the seventh embodiment.

In the present example, AlTiC substrate was used as the substrate. On the AlTiC substrate, lower magnetic shield 10 (NiFe 100 nm), foundation insulating layer 80 ($SiO_2$ 3 nm), silicon channel layer 7 (Si 10 nm), first tunnel layer 81A and second tunnel layer 81B (MgO 1 nm), first ferromagnetic layer 12A and second ferromagnetic layer 12B (CoFe 5 nm), antiferromagnetic layer 13 (IrMn 14 nm) and cap layer 15 (Ta 3 nm) were formed. After that, an annealing of 3 hours was applied under 250° C. and 3 kOe in order to fix the magnetic anisotropy of anti ferromagnetic layer 13.

A photo mask was formed to as strip shape (20×200 nm) and the laminated film was milled to leave lower magnetic shield 10 by ion milling. The milled place was covered by insulating layer 8 ($SiO_2$ 10 nm) with no side wall of the laminated film exposed. On one terminal of the longitudinal direction on the laminated film with a strip shape, a mask (20×20 nm) a the place which would be first ferromagnetic layer 12A was disposed. On the other terminal, a mask (20×50 nm) at the place which would be first reference electrode 20 was disposed. And at the position 40 nm away from the mask of the place which would be first ferromagnetic layer 12A in the longitudinal direction, a mask (20×40 nm) of the place which would be second ferromagnetic layer 12B was disposed. After that, milling was performed. by ion milling to expose silicon channel layer 7. The milled place was covered by insulating layer 8 ($SiO_2$ 10 nm) with no side wall of the laminated film exposed.

After that, photoresist was formed on the places other than first ferromagnetic layer 12A, and ion milling was performed until first ferromagnetic layer 12A was exposed. Then, cap layer 15 (Ta 3 nm) was formed on first ferromagnetic layer 12A and antiferromagnetic layer 13 which was placed on second ferromagnetic layer 12A. After that, photoresist was formed in the place other than the place which would be first reference electrode 20. Ion milling was performed until silicon channel layer 7 was exposed. And aluminium (Al 5 nm) was formed as first reference electrode 20.

First upper magnetic shield layer 11A was formed on first ferromagnetic layer 12A by a lift-off method. Similarly, second upper magnetic shield layer 12B was formed, on second ferromagnetic layer 12B by a lift-off method. After that, a pad for wiring was formed and the wiring of circuit was performed as shown in FIG. 8.

The element substrate prepared was processed, and elements were cut out one by one. First ferromagnetic layer 12A was milled to expose on the side face of the substrate. An insulating layer was formed on the milled part. A processed element was disposed on the slider of the magnetic head and performed with wiring and then it was floated over a magnetic recording medium. It was confirmed that the obtained element could function as a magnetic head by reading the information.

Example 18

FIG. 9 is the structural view of the element of the magnetoresistive element of the eighth embodiment and Example 18. FIG. 10 is a cross sectional view along the C-C line of FIG. 9. The magnetoresistive element of Example 18 was prepared by the same way as Example 17. However, silicon channel layer 7 in Example 17 was not in a strip shape, but was formed with a structure in which longitudinal structure 7A (80×20 nm) and latitudinal structure 7B (20× 200 nm) were connected in a T-shape. Second ferromagnetic layer 12B was disposed on connection portion 7C of longitudinal structure 7A and latitudinal structure 713. First ferromagnetic layer 12A was disposed on the terminal of latitudinal structure 713 away from second ferromagnetic layer 12B. In addition, first reference electrodes 20 were disposed on both terminals of longitudinal structure 7A.

The structure of the wiring was the same as Example 17 except that the wiring between second ferromagnetic layer 12B and first reference electrode 20 was performed between first reference electrodes 20 on the two terminals and second ferromagnetic layer 12B.

Same evaluations as Example 17 were carried out and the results turned out to be that Example 18 could work under an S/N higher than Example 17. The reasons were considered to be the two as follows. The first is the effect of the backfire of the spin current. A spin polarized current was flowing to silicon channel layer 7 from second ferromagnetic layer 12B. When the spin polarized current flowed in a direction within silicon channel layer 7, the spin current would. flow in the part without current flawing in the opposite direction to the spin polarized current. In Example 17, first ferromagnetic layer 12A, second ferromagnetic layer 12B and first reference electrode 20 were arranged in a straight line and became a state with a backfire of spin current generated on the side of first reference electrode 20. In Example 18, second ferromagnetic layer 12B was disposed on connection portion 7C of longitudinal structure 7A and latitudinal structure 7B, thus, even a backfire of spin current was generated, the spin current would be easily accumulated right under second ferromagnetic layer 12B because silicon channel layer 7 broke off immediately. By this effect, the output related to the spin increased barely. The other one is that voltage drop inside second ferromagnetic layer 12B was not measured in Example 18. Usually, current was flowing in the direction vertical to the lamination direction of second ferromagnetic layer 12B, thus, no voltage change would be generated in the laminated plane. However, second tunnel layer 81B was disposed between second ferromagnetic layer 12B and silicon channel layer 7. Although second tunnel layer 81B was formed uniformly, the very slight irregularity in the uniformity of the film thickness will contribute to the ununiformity of the tunnel current easily. The ununiformity of the tunnel current in second tunnel layer 81B would generate a difference in the voltage in the laminated plane of second ferromagnetic layer 12B. Voltages were measured from both first reference electrodes 20 relative to second ferromagnetic layer 12B and the difference of the voltages in the laminated plane of second ferromagnetic layer was averaged. The evaluation could be carried out Thereby way, so extra measuring for voltage drop was not needed. The above two points were considered to be the reasons for that Example 18 could work under a higher S/N than Example 17.

DESCRIPTION OF REFERENCE NUMERALS 1 silicon substrate
2 silicon oxide film
3 semiconductor channel layer
7 silicon channel layer
7A longitudinal structure
7B latitudinal structure
7C connection portion
8 insulating layer
11A first upper magnetic shield
11B second upper magnetic shield
12A first ferromagnetic layer
12B second ferromagnetic layer
13 antiferromagnetic layer
14 gate electrode
15 cap layer
29 first reference electrode
21 second reference electrode
30 MOSFET for output amplification
81A first tunnel layer
81B second tunnel layer
100, 200, 300, 400, 500, 600, 800 magnetoresistive element
700 900 magnetic sensor
IS current source
VS voltage source
VD voltage meter
80 foundation insulating layer

What is claimed is:

1. A magnetoresistive element comprising
a semiconductor channel layer,
a first ferromagnetic layer disposed on the semiconductor channel layer,
a second ferromagnetic layer disposed away from the first ferromagnetic layer on the semiconductor channel layer,
a nonmagnetic first reference electrode disposed away from the first ferromagnetic layer and the second ferromagnetic layer on the semiconductor channel layer,
wherein, current is input from the second ferromagnetic layer to the first ferromagnetic layer through the semiconductor channel layer,
a voltage between the second ferromagnetic layer and the first reference electrode is output.

2. The magnetoresistive element according to claim 1, wherein,
the magnetoresistive element contains at least one selected from a first tunnel layer and a second tunnel layer,
wherein, the first tunnel layer is disposed between the first ferromagnetic layer and the semiconductor channel layer, and
the second tunnel layer is disposed between the second ferromagnetic layer and the semiconductor channel layer.

3. The magnetoresistive element according to claim 2, wherein,
the magnetoresistive element contains both the first tunnel layer and the second tunnel layer.

4. The magnetoresistive element according to claim 1, wherein,
a distance between the first ferromagnetic layer and the second ferromagnetic layer is shorter than a spin transport distance in the semiconductor channel layer.

5. The magnetoresistive element according to claim 1, wherein,
the second ferromagnetic layer is disposed between the first ferromagnetic layer and the first reference electrode.

6. The magnetoresistive element according to claim 1, wherein,
a coercivity of the second ferromagnetic layer is different from a coercivity of the first ferromagnetic layer.

7. The magnetoresistive element according to claim 1, wherein,
the semiconductor channel layer contains any one selected from the group consisting of Si, Ge, SiGe, GaAs, InAs, SiC, Graphene, Graphite and Silicene.

8. The magnetoresistive element according to claim 1, wherein,
the semiconductor channel layer contains a PEDOT:PSS.

9. The magnetoresistive element according to claim 1, wherein,
the semiconductor channel layer has a structure with a longitudinal structure and a latitudinal structure connected in a T shape,
the second ferromagnetic layer is disposed on a connecting part of the longitudinal structure and the latitudinal structure,
the first ferromagnetic layer is disposed on the latitudinal structure away from the second ferromagnetic layer, and
the first reference electrode is disposed on the longitudinal structure away from the second ferromagnetic layer.

10. The magnetoresistive element according to claim 1, wherein,
the magnetoresistive element further contains a MOSFET, wherein
the second ferromagnetic layer is electrically connected with a gate electrode of the MOSFET,
the first reference electrode is electrically connected with a source electrode of the MOSFET, and
a voltage between the second ferromagnetic layer and the first reference electrode is amplified by the MOSFET.

11. A spin-MOSFET using the magnetoresistive element according to claim 1.

12. A magnetic sensor using the magnetoresistive element according to claim 1.

13. A magnetic head using the magnetoresistive element according to claim 1.

* * * * *